US012089368B2

(12) United States Patent
Bean, Jr. et al.

(10) Patent No.: US 12,089,368 B2
(45) Date of Patent: Sep. 10, 2024

(54) SYSTEM AND METHOD FOR COOLING COMPUTING DEVICES USING A PRIMARY CIRCUIT DIELECTRIC COOLING FLUID

(71) Applicant: Green Revolution Cooling, Inc., Austin, TX (US)

(72) Inventors: John Bean, Jr., Austin, TX (US); Paul Dierkes, Austin, TX (US); Shiraz Gulraiz, Austin, TX (US)

(73) Assignee: Green Revolution Cooling, Inc., Austin, TX (US)

( * ) Notice: Subject to any disclaimer, the term of this patent is extended or adjusted under 35 U.S.C. 154(b) by 0 days.

(21) Appl. No.: 18/244,681

(22) Filed: Sep. 11, 2023

(65) Prior Publication Data

US 2024/0090169 A1 Mar. 14, 2024

Related U.S. Application Data

(60) Provisional application No. 63/406,558, filed on Sep. 14, 2022.

(51) Int. Cl.
*H05K 7/20* (2006.01)

(52) U.S. Cl.
CPC ..... *H05K 7/20272* (2013.01); *H05K 7/20236* (2013.01); *H05K 7/20263* (2013.01); *H05K 7/20781* (2013.01)

(58) Field of Classification Search
None
See application file for complete search history.

(56) References Cited

U.S. PATENT DOCUMENTS

| 1,606,025 A | 11/1926 | Gruendler |
| 2,440,930 A | 5/1948 | Guglielmo et al. |
| (Continued) | | |

FOREIGN PATENT DOCUMENTS

| AU | 2009282170 B2 | 11/2014 |
| CN | 101443724 A | 5/2009 |
| (Continued) | | |

OTHER PUBLICATIONS

Office Action for Chinese Application No. 200980131707.3, mailed Apr. 18, 2014, 7 pages.
(Continued)

*Primary Examiner* — Courtney L Smith
(74) *Attorney, Agent, or Firm* — THE MARBURY LAW GROUP, PLLC

(57) ABSTRACT

An immersion cooling system is configured for uniform fluid distribution across computing devices and includes a tank defining an open interior volume, a distribution pipe having a plurality of ports, a distribution plate having a pattern of holes is positioned over the distribution pipe. A siphon wall divides the open interior volume into a first chamber and a second chamber, and the distribution plate and the distribution pipe are in the first chamber. The dielectric cooling fluid enters the first chamber of the tank through the plurality of ports in the distribution pipe, and flows through the pattern of holes in the distribution plate to contact the at least one computing device. The heat dissipates from the at least one computing device into the dielectric cooling fluid, which flows through the siphon wall into the second chamber via a transfer port that is located below a dielectric cooling fluid surface.

17 Claims, 13 Drawing Sheets

(56) References Cited

U.S. PATENT DOCUMENTS

| | | |
|---|---|---|
| 2,525,457 A | 10/1950 | Paluev |
| 2,643,282 A | 6/1953 | Greene |
| 3,094,133 A | 6/1963 | Treanor |
| 3,320,762 A | 5/1967 | Murdoch |
| 3,406,244 A | 10/1968 | Sevgin |
| 3,450,265 A | 6/1969 | Kreusch et al. |
| 3,489,207 A | 1/1970 | Miller |
| 3,600,636 A | 8/1971 | Petersen |
| 3,754,741 A | 8/1973 | Whitehurst et al. |
| 3,858,090 A | 12/1974 | Lehmann |
| 4,034,335 A | 7/1977 | Harazoe et al. |
| 4,245,668 A | 1/1981 | Lindstrom |
| 4,302,793 A | 11/1981 | Rohner |
| 4,313,310 A | 2/1982 | Kobayashi et al. |
| 4,372,632 A | 2/1983 | Mlla et al. |
| 4,399,501 A | 8/1983 | Masselin |
| 4,460,008 A | 7/1984 | O'Leary et al. |
| 4,464,315 A | 8/1984 | O'Leary |
| 4,493,010 A | 1/1985 | Morrison et al. |
| 4,590,538 A | 5/1986 | Cray, Jr. |
| 4,600,230 A | 7/1986 | Ise |
| 4,648,043 A | 3/1987 | O'Leary |
| 4,659,459 A | 4/1987 | O'Leary et al. |
| 4,704,658 A | 11/1987 | Yokouchi et al. |
| 4,722,577 A | 2/1988 | Mewborne |
| 4,741,385 A | 5/1988 | Bergles et al. |
| 4,834,257 A | 5/1989 | Book et al. |
| 5,102,503 A | 4/1992 | Silinski et al. |
| 5,145,585 A | 9/1992 | Coke |
| 5,260,850 A | 11/1993 | Sherwood et al. |
| 5,294,916 A | 3/1994 | Bolton et al. |
| 5,297,621 A | 3/1994 | Taraci et al. |
| 5,329,418 A | 7/1994 | Tanabe |
| 5,332,494 A | 7/1994 | Eden et al. |
| 5,414,591 A | 5/1995 | Kimura et al. |
| 5,574,627 A | 11/1996 | Porter |
| 5,655,459 A | 8/1997 | O'Connor et al. |
| 5,851,143 A | 12/1998 | Hamid |
| 5,907,473 A | 5/1999 | Przilas et al. |
| 6,019,167 A | 2/2000 | Bishop et al. |
| 6,374,627 B1 | 4/2002 | Schumacher et al. |
| D477,617 S | 7/2003 | Resch |
| 6,600,656 B1 | 7/2003 | Mori et al. |
| 6,616,851 B1 | 9/2003 | Sforza-Heinen et al. |
| 6,621,707 B2 | 9/2003 | Ishimine et al. |
| D483,045 S | 12/2003 | Resch |
| 6,909,606 B2 | 6/2005 | Barsun et al. |
| 7,086,247 B2 | 8/2006 | Campbell et al. |
| D530,346 S | 10/2006 | Resch |
| 7,184,269 B2 | 2/2007 | Campbell et al. |
| 7,210,304 B2 | 5/2007 | Nagashima et al. |
| 7,278,273 B1 | 10/2007 | Whitted et al. |
| 7,307,841 B2 | 12/2007 | Berlin et al. |
| 7,318,322 B2 | 1/2008 | Ota et al. |
| 7,403,392 B2 | 7/2008 | Attlesey et al. |
| 7,413,394 B2 | 8/2008 | Risser |
| 7,511,959 B2 | 3/2009 | Belady et al. |
| 7,511,960 B2 | 3/2009 | Hillis et al. |
| 7,551,971 B2 | 6/2009 | Hillis |
| 7,604,027 B2 | 10/2009 | Thatcher |
| 7,609,518 B2 | 10/2009 | Hopton et al. |
| 7,686,175 B2 | 3/2010 | Waisanen |
| 7,724,513 B2 | 5/2010 | Coglitore et al. |
| 7,724,517 B2 | 5/2010 | Attlesey et al. |
| 7,757,506 B2 | 7/2010 | Ellsworth, Jr. et al. |
| 7,843,298 B2 | 11/2010 | Hosokawa et al. |
| 7,854,652 B2 | 12/2010 | Yates et al. |
| 7,856,838 B2 | 12/2010 | Hillis et al. |
| 7,905,106 B2 | 3/2011 | Attlesey |
| 7,911,782 B2 | 3/2011 | Attlesey et al. |
| 7,911,793 B2 | 3/2011 | Attlesey |
| 7,934,386 B2 | 5/2011 | Rummel et al. |
| 7,961,463 B2 | 6/2011 | Belady et al. |
| 7,971,632 B2 | 7/2011 | Eriksen |
| 7,983,040 B2 | 7/2011 | Campbell et al. |
| 8,009,419 B2 | 8/2011 | Attlesey et al. |
| 8,047,904 B2 | 11/2011 | Yates et al. |
| 8,213,261 B2 | 7/2012 | Imhof et al. |
| 8,295,047 B1 | 10/2012 | Hamburgen et al. |
| 8,310,829 B2 | 11/2012 | Monk et al. |
| 8,654,529 B2 | 2/2014 | Attlesey |
| 8,817,465 B2 | 8/2014 | Campbell et al. |
| 8,964,391 B2 | 2/2015 | Campbell et al. |
| 9,042,098 B2 | 5/2015 | Campbell et al. |
| 9,049,800 B2 | 6/2015 | Shelnutt et al. |
| 9,086,859 B2 * | 7/2015 | Attlesey ............... F28D 1/0206 |
| D744,996 S | 12/2015 | Keisling et al. |
| 9,269,544 B2 | 2/2016 | Koo et al. |
| 9,386,727 B2 | 7/2016 | Barringer et al. |
| 9,439,327 B1 | 9/2016 | Sheng et al. |
| 9,504,190 B2 * | 11/2016 | Best ..................... H05K 7/2079 |
| 9,664,180 B2 | 5/2017 | Saavedra |
| 9,699,938 B2 | 7/2017 | Shelnutt et al. |
| D796,654 S | 9/2017 | Baker et al. |
| 9,756,766 B2 | 9/2017 | Best |
| 9,801,465 B1 | 10/2017 | Finch, Jr. |
| 9,861,194 B1 | 1/2018 | Park |
| D821,326 S | 6/2018 | Kreiner |
| 9,992,914 B2 | 6/2018 | Best et al. |
| 10,123,463 B2 | 11/2018 | Best et al. |
| 10,212,849 B2 | 2/2019 | Matsumoto et al. |
| 10,306,804 B2 | 5/2019 | Chester et al. |
| D852,936 S | 7/2019 | Baker et al. |
| 10,342,164 B2 | 7/2019 | So et al. |
| 10,405,457 B2 | 9/2019 | Boyd et al. |
| D875,206 S | 2/2020 | Gourgel et al. |
| 10,667,427 B2 | 5/2020 | Gao |
| 10,743,438 B2 | 8/2020 | Wakino et al. |
| 10,820,446 B2 | 10/2020 | Boyd et al. |
| 10,939,581 B1 | 3/2021 | Chen et al. |
| 11,000,943 B2 | 5/2021 | Reynolds |
| 11,026,344 B2 * | 6/2021 | Midgley ................... G06F 1/20 |
| 11,359,865 B2 | 6/2022 | Stone et al. |
| 11,369,041 B2 | 6/2022 | Yang et al. |
| 11,457,735 B1 | 10/2022 | D'Lsep |
| 11,516,943 B2 * | 11/2022 | Bilan ................ H05K 7/20236 |
| 11,856,727 B2 * | 12/2023 | Montes Monteserin ................... H05K 7/20236 |
| 11,925,946 B2 * | 3/2024 | Bean, Jr. ............ H05K 7/20236 |
| 2002/0014460 A1 | 2/2002 | McKay |
| 2002/0080575 A1 | 6/2002 | Nam et al. |
| 2002/0151799 A1 | 10/2002 | Pantages et al. |
| 2002/0185262 A1 | 12/2002 | Baer |
| 2002/0189173 A1 | 12/2002 | Staschik |
| 2003/0053293 A1 | 3/2003 | Beitelmal et al. |
| 2003/0127240 A1 | 7/2003 | Beckbissinger et al. |
| 2004/0008490 A1 | 1/2004 | Cheon |
| 2004/0013563 A1 | 1/2004 | Romer et al. |
| 2004/0050491 A1 | 3/2004 | Miya et al. |
| 2004/0223300 A1 | 11/2004 | Fink et al. |
| 2004/0246683 A1 | 12/2004 | Honsberg-Riedl et al. |
| 2004/0254682 A1 | 12/2004 | Kast |
| 2005/0011839 A1 | 1/2005 | Dart et al. |
| 2005/0024826 A1 | 2/2005 | Bash et al. |
| 2005/0052847 A1 | 3/2005 | Hamman |
| 2005/0083657 A1 | 4/2005 | Hamman |
| 2005/0111184 A1 | 5/2005 | Cliff et al. |
| 2005/0114876 A1 | 5/2005 | Atarashi et al. |
| 2005/0152112 A1 | 7/2005 | Holmes et al. |
| 2005/0259402 A1 | 11/2005 | Yasui et al. |
| 2006/0026610 A1 | 2/2006 | Sasao et al. |
| 2006/0064709 A1 | 3/2006 | Throckmorton et al. |
| 2006/0123436 A1 | 6/2006 | Tanaka et al. |
| 2006/0135042 A1 | 6/2006 | Frost et al. |
| 2006/0250755 A1 | 11/2006 | Tilton et al. |
| 2006/0274501 A1 | 12/2006 | Miller |
| 2007/0006599 A1 | 1/2007 | Kawamura et al. |
| 2007/0025081 A1 | 2/2007 | Berlin et al. |
| 2007/0029011 A1 | 2/2007 | Thatcher |
| 2007/0034360 A1 | 2/2007 | Hall |
| 2007/0199340 A1 | 8/2007 | Knight et al. |
| 2007/0213000 A1 | 9/2007 | Day |
| 2007/0227710 A1 | 10/2007 | Belady et al. |
| 2007/0267741 A1 | 11/2007 | Attlesey et al. |

(56) References Cited

U.S. PATENT DOCUMENTS

| | | |
|---|---|---|
| 2008/0002364 A1 | 1/2008 | Campbell et al. |
| 2008/0017355 A1 | 1/2008 | Attlesey et al. |
| 2008/0026509 A1 | 1/2008 | Campbell et al. |
| 2008/0029250 A1 | 2/2008 | Carlson et al. |
| 2008/0030945 A1 | 2/2008 | Mojaver et al. |
| 2008/0055845 A1 | 3/2008 | Murakami et al. |
| 2008/0158818 A1 | 7/2008 | Clidaras et al. |
| 2008/0174954 A1 | 7/2008 | Vangilder et al. |
| 2008/0180908 A1 | 7/2008 | Wexler |
| 2008/0196868 A1 | 8/2008 | Attlesey et al. |
| 2008/0196870 A1 | 8/2008 | Attlesey et al. |
| 2008/0209931 A1 | 9/2008 | Stevens |
| 2008/0266726 A1 | 10/2008 | Murakami et al. |
| 2008/0270572 A1 | 10/2008 | Belady et al. |
| 2008/0273306 A1 | 11/2008 | Campbell et al. |
| 2009/0168345 A1 | 7/2009 | Martini |
| 2009/0219681 A1 | 9/2009 | Goth et al. |
| 2009/0229194 A1 | 9/2009 | Armillas |
| 2009/0251860 A1 | 10/2009 | Belady et al. |
| 2009/0260777 A1 | 10/2009 | Attlesey |
| 2009/0262455 A1 | 10/2009 | Merrow |
| 2009/0295167 A1 | 12/2009 | Clidaras et al. |
| 2010/0027212 A1 | 2/2010 | Daunert Armillas |
| 2010/0030267 A1 | 2/2010 | Winslow et al. |
| 2010/0033070 A1 | 2/2010 | Cheng |
| 2010/0061057 A1 | 3/2010 | Dersch et al. |
| 2010/0103618 A1 | 4/2010 | Campbell et al. |
| 2010/0139887 A1 | 6/2010 | Slessman |
| 2010/0165565 A1 | 7/2010 | Hellriegal et al. |
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |
| 2010/0290190 A1 | 11/2010 | Chester et al. |
| 2010/0302678 A1 | 12/2010 | Merrow |
| 2011/0075353 A1 | 3/2011 | Attlesey et al. |
| 2011/0103019 A1 | 5/2011 | Campbell et al. |
| 2011/0120885 A1 | 5/2011 | Miller et al. |
| 2011/0132579 A1 | 6/2011 | Best et al. |
| 2011/0134604 A1 | 6/2011 | Attlesey |
| 2011/0151765 A1 | 6/2011 | Chen et al. |
| 2011/0157829 A1 | 6/2011 | Wormsbecher et al. |
| 2011/0183051 A1 | 7/2011 | Skender |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1 | 7/2012 | Dunnavant |
| 2012/0236487 A1 | 9/2012 | Wallace et al. |
| 2012/0294737 A1 | 11/2012 | Singh et al. |
| 2012/0300391 A1 | 11/2012 | Keisling et al. |
| 2013/0025888 A1 | 1/2013 | Eckholm et al. |
| 2013/0032217 A1 | 2/2013 | Pesek et al. |
| 2013/0075066 A1 | 3/2013 | Reytblat |
| 2013/0105120 A1 | 5/2013 | Campbell et al. |
| 2013/0105139 A1 | 5/2013 | Campbell et al. |
| 2013/0146273 A1 | 6/2013 | Chester et al. |
| 2014/0060773 A1 | 3/2014 | Wajima |
| 2014/0060799 A1 | 3/2014 | Eckberg et al. |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0211412 A1 | 7/2014 | Best |
| 2014/0216686 A1 | 8/2014 | Shelnutt et al. |
| 2014/0218858 A1 | 8/2014 | Shelnutt et al. |
| 2014/0301037 A1 | 10/2014 | Best |
| 2014/0307384 A1* | 10/2014 | Best ................... H05K 7/1497 |
| | | 361/679.53 |
| 2014/0362527 A1 | 12/2014 | Best |
| 2015/0048950 A1 | 2/2015 | Zeighami et al. |
| 2015/0062806 A1 | 3/2015 | Shelnutt et al. |
| 2015/0138723 A1 | 5/2015 | Shedd et al. |
| 2015/0181762 A1 | 6/2015 | Boyd et al. |
| 2015/0195953 A1 | 7/2015 | Best et al. |
| 2015/0276292 A1 | 10/2015 | Son et al. |
| 2015/0305209 A1 | 10/2015 | Inaba et al. |
| 2015/0334880 A1* | 11/2015 | Best ................... H05K 7/20836 |
| | | 361/679.47 |
| 2015/0359145 A1 | 12/2015 | Zhang et al. |
| 2016/0234970 A1 | 8/2016 | Shelnutt et al. |
| 2017/0142868 A1 | 5/2017 | Chen et al. |
| 2017/0265328 A1 | 9/2017 | Sasaki et al. |
| 2017/0303443 A1 | 10/2017 | Inano et al. |
| 2017/0332514 A1 | 11/2017 | Saito |
| 2017/0359918 A1 | 12/2017 | Klaba et al. |
| 2018/0020571 A1* | 1/2018 | Saito ................... H05K 7/20636 |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2019/0200482 A1 | 6/2019 | Boyd et al. |
| 2019/0329973 A1 | 10/2019 | Chabot |
| 2019/0344424 A1 | 11/2019 | Reynolds |
| 2019/0387641 A1 | 12/2019 | Aoki et al. |
| 2020/0093038 A1 | 3/2020 | Enright et al. |
| 2020/0323108 A1 | 10/2020 | Bilan et al. |
| 2021/0105910 A1 | 4/2021 | McCarthy |
| 2021/0368656 A1 | 11/2021 | Heydari |
| 2021/0382533 A1 | 12/2021 | Heydari |
| 2021/0400834 A1 | 12/2021 | Shen et al. |
| 2022/0220976 A1 | 7/2022 | Perevozchikov et al. |
| 2022/0248564 A1 | 8/2022 | Moon |
| 2023/0052701 A1 | 2/2023 | Chen et al. |
| 2023/0269900 A1 | 8/2023 | Kelly et al. |

FOREIGN PATENT DOCUMENTS

| | | |
|---|---|---|
| CN | 109769381 A | 5/2019 |
| CN | 109874275 A | 6/2019 |
| CN | 111240448 A | 6/2020 |
| CN | 113795118 A | 12/2021 |
| CN | 114138084 A | 3/2022 |
| CN | 115407848 A | 11/2022 |
| GB | 82014500002000 | 5/2022 |
| JP | 2004319628 A | 11/2004 |
| JP | 2004363308 A | 12/2004 |
| JP | 2005015171 A | 1/2005 |
| JP | 2011518395 A | 6/2011 |
| JP | 2018019038 A | 2/2018 |
| JP | 2019161201 A | 9/2019 |
| JP | 2021519978 A | 8/2021 |
| KR | 20150018884 A | 2/2015 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |
| WO | 2019061721 A1 | 4/2019 |
| WO | 2020234600 A1 | 11/2020 |

OTHER PUBLICATIONS

Office Action for Chinese Application No. 200980131707.3, mailed Dec. 31, 2014, 10 pages.

Office Action for Chinese Application No. 200980131707.3, mailed Jul. 31, 2013, 8 pages.

Office Action for Chinese Application No. 201280049039.1, mailed Oct. 27, 2015, 33 pages.

Office Action from U.S. Appl. No. 13/057,881, dated Apr. 11, 2014, 16 pages.

Office Action from U.S. Appl. No. 13/057,881, dated Jan. 9, 2015, 3 pages.

Office Action from U.S. Appl. No. 13/057,881, dated Jun. 4, 2013, 13 pages.

Office Action from U.S. Appl. No. 13/057,881, dated Mar. 3, 2015, 20 pages.

Park J, "New Cooling Strategies for Greater Data Center Energy Efficiency," Facebook, Nov. 4, 2010, 4 pages.

(56) References Cited

OTHER PUBLICATIONS

Patent Examination Report No. 2 for Australian Application No. 2009282170, mailed Jun. 18, 2014, 4 pages.
Patent Examination Report No. 2 for Australian Application No. 2009282170, mailed Nov. 15, 2013, 4 pages.
Substantive Examination Adverse Report for Malaysian Application No. PI2011000494, mailed May 15, 2015, 3 pages.
Supplementary Examination Report for Singapore Application No. 11202000306X, mailed Nov. 18, 2022, 4 pages.
"The Green500 List—Nov. 2013," The Green 500, Nov. 20, 2013, 3 pages.
U.S. Appl. No. 13/057,881, filed Feb. 7, 2011, Christiaan Scott Best, 72 pages.
U.S. Appl. No. 14/338,013, filed Jul. 22, 2014, Christiaan Scott Best, 60 pages.
U.S. Appl. No. 14/338,020, filed Jul. 22, 2014, Christiaan Scott Best, 60 pages.
U.S. Appl. No. 14/338,026, filed Jul. 22, 2014, Christiaan Scott Best, 60 pages.
U.S. Appl. No. 14/338,035, filed Jul. 22, 2014, Christiaan Scott Best, 60 pages.
U.S. Appl. No. 14/667,091, filed Mar. 24, 2015, Christiaan Scott Best, 65 pages.
Written Opinion and Search Report for Singapore Application No. 201100595-6, mailed Apr. 16, 2012, 20 pages.
Written Opinion and Search Report for Singapore Application No. 201100595-6, mailed May 2, 2012, 21 pages.
Applicant-Initiated Interview Summary from U.S. Appl. No. 13/057,881, dated Feb. 25, 2014, 4 pages.
Applicant-Initiated Interview Summary from U.S. Appl. No. 13/057,881, dated Jul. 1, 2014, 3 pages.
Applicant-Initiated Interview Summary from U.S. Appl. No. 13/057,881, dated Oct. 9, 2014, 3 pages.
Bakker A., "Modeling Flow Fields in Stirred Tanks," Reacting Flows—Lecture 7, 2006, 40 pages.
Communication pursuant to Article 94(3) EPC for European Patent Application No. 09807136.8, dated Nov. 26, 2018, 13 pages.
"Disruptive Technologies," SC|09, Disruptive Technologies Presentations, Retrieved from http://sc09.supercomputing.org/index-pg=disrupttech.html, Nov. 14-20, 2009, 2 pages.
"Disruptive Technologies," SC10 Disruptive Technologies, Retrieved from http://sc10.supercomputing.org/index-pg=disrupttech.html, Nov. 13-19, 2010, 8 pages.
Extended European Search Report for European Application No. 09807136.8, mailed Jun. 6, 2017, 12 Pages.
Extended European Search Report for European Application No. 12821634.8, mailed Jul. 15, 2015, 6 pages.
Final Office Action from U.S. Appl. No. 13/057,881, dated Jun. 16, 2015, 30 pages.
Final Office Action from U.S. Appl. No. 13/057,881, dated Nov. 22, 2013, 13 pages.
Final Office Action from U.S. Appl. No. 13/057,881, dated Nov. 3, 2014, 23 pages.
"GRC ICE Immersion Cooling Solutions Brochure," Retrieved from https://www.grcooling.com/wp-content/uploads/2018/06/GRC_ICE_Product_Brochure.pdf, Jun. 2018, 4 pages.
"GRC ICEraQ® Series 10 Launch Event Presentation," Retrieved from https://digitalinfranetwork.com/videos/655447036-2/, Dec. 27, 2021, 1 page.
"GRC® Releases the Next Generation of Data Center Liquid Immersion Cooling, Providing Increased Sustainability Capable of Delivering a PUE Yield of 1.03 and a Significant Reduction in Operating Costs," Retrieved https://www.businesswire.com/news/home/20210518005857/en/GRC%C2%AE-Releases-the-Next-Generation-of-Data-Center-Liquid-Immersion-Cooling-Providing-Increased-Sustainability-Capable-of-Delivering-a-PUE-Yield-of-1.03-and-a-Significant-Reduction-in-Operating-Costs, May 18, 2021, 3 pages.
"Green Revolution Cooling Named a Disruptive Technology of the Year at SC'10," Press Release, Nov. 1, 2010, 1 page.
"Green Revolution Cooling Named Disruptive at SC'09," Press Release, Aug. 3, 2009, 1 page.
Hernandez P., "Are Liquid-Cooled Servers Coming to a Data Center Near You?," CleanTech, Dec. 4, 2009, 2 pages.
Hernandez P., "Will IT Managers Warm to Liquid-Cooled Servers?," Green Revolution Cooling, Dec. 8, 2009, 3 pages.
"ICEraQ 10 Quad Duo-Specification Sheet," Retrieved from https://www.grcooling.com/wp-content/uploads/2018/06/GRC_Data_Sheet_ICEraQ_Quad-Duo-One.pdf, 2021, 2 pages.
Intel, "Intel® Core™ 2 Duo Processor on 65 nm Process for Embedded Applications," Thermal Design Guide, Aug. 2007, pp. 1, 14, and 21.
Intel, "Intel® Pentium® 4 Processor on 90 nm Process," Datasheet, Feb. 2005, pp. 64-65.
"Intel Xeon Processor E7-4800/8800 v3 Product Families", May 2015, p. 46 (1 page).
International Preliminary Report on Patentability, Application No. PCT/US2014/033081, mailed Oct. 15, 2015, 7 pages.
International Preliminary Report on Patentability, Application No. PCT/US2014/037005, mailed Nov. 19, 2015, 12 pages.
International Preliminary Report on Patentability for International Application No. PCT/US2009/053305, mailed Feb. 24, 2011, 19 pages.
International Preliminary Report on Patentability for International Application No. PCT/US2015/030618, mailed Nov. 24, 2016, 10 pages.
International Search Report and Written Opinion for International Application No. PCT/US2009/053305, mailed Oct. 14, 2009, 17 pages.
International Search Report and Written Opinion for International Application No. PCT/US20115/030618, mailed Aug. 5, 2015, 12 pages.
International Search Report and Written Opinion for International Application No. PCT/US2012/049668, mailed Oct. 19, 2012, 10 pages.
International Search Report and Written Opinion for International Application No. PCT/US2014/017835, mailed Jun. 13, 2014, 9 pages.
International Search Report and Written Opinion for International Application No. PCT/US2014/033081, mailed Aug. 27, 2014, 9 pages.
International Search Report and Written Opinion for International Application No. PCT/US2014/033834, mailed Sep. 15, 2014, 16 pages.
International Search Report and Written Opinion for International Application No. PCT/US2014/037005, mailed Sep. 24, 2014, 18 pages.
International Search Report and Written Opinion for International Application No. PCT/US2015/43468, mailed Oct. 30, 2015, 11 pages.
International Search Report and Written Opinion for International Application No. PCT/US2021/058991, dated Mar. 3, 2022, 10 pages.
International Search Report and Written Opinion for International Application No. PCT/US2022/043817, mailed Jan. 10, 2023, 10 pages.
International Search Report and Written Opinion for International Application No. PCT/US2023/016342, mailed Jul. 13, 2023, 8 pages.
Lee S.Y., "Hydraulics and Mixing Evaluations for NT-21/41 Tanks," Revision 0, Oct. 2014, 32 pages.
Markoff J., "Data Centers' Power Use Less Than Was Expected," The New York Times, Jul. 31, 2011, 3 pages.
Miller R, "Data Center Used to Heat Swimming Pool," Data Center Knowledge, Retrieved from https://www.datacenterknowledge.com/archives/2008/04/02/data-center-used-to-heat-swimming-pool, Apr. 2, 2008, 2 pages.
Non-Final Office Action in U.S. Appl. No. 14/667,091, mailed May 22, 2015, 30 pages.
Non-final Office Action, U.S. Appl. No. 14/237,100, mailed Sep. 30, 2015, 21 pages.
Non-final Office Action, U.S. Appl. No. 14/245,978, mailed Jan. 13, 2016, 11 pages.

(56) References Cited

OTHER PUBLICATIONS

Non-final Office Action, U.S. Appl. No. 14/251,014, mailed Dec. 4, 2015, 13 pages.
Non-final Office Action, U.S. Appl. No. 14/271,386, mailed Dec. 17, 2015, 17 pages.
Notice of Acceptance for Australian Application No. 2009282170, mailed Nov. 14, 2014, 2 pages.
Office Action and Search Report for Chinese Application No. 200980131707.3, mailed Dec. 20, 2012, 17 pages.
Office Action for Canadian Application No. 2731994, mailed Dec. 3, 2015, 6 pages.
Office Action for Canadian Application No. 2731994, mailed Nov. 8, 2016, 4 pages.
International Search Report and Written Opinion in PCT/US2023/032438, mailed Dec. 27, 2023, 9 pages.
International Search Report and Written Opinion for International Application No. PCT/US2023/026959, mailed Oct. 23, 2023, 8 pages.
Office Action for Chinese Application No. 200980131707.3, mailed Apr. 3, 2013, 3 pages.
Office Action for Chinese Application No. 200980131707.3, mailed Dec. 13, 2013, 4 pages.
International Preliminary Report on Patentability in corresponding Application No. PCT/US2022/043817, mailed Mar. 28, 2024 (6 pages).
International Search Report and Written Opinion in corresponding Application No. PCT/US2024/010084, mailed May 1, 2024 (11 pages).
Office Action from U.S. Appl. No. 17/523,403, dated Nov. 10, 2021, 26 pages.
Non-Final Office Action in U.S. Appl. No. 17/900,541, mailed Jun. 17, 2024, 8 pages.

* cited by examiner

SYSTEM AND METHOD FOR COOLING COMPUTING DEVICES USING A PRIMARY CIRCUIT DIELECTRIC COOLING FLUID

RELATED APPLICATIONS

This application claims priority to U.S. Provisional Patent Application No. 63/406,558 entitled "System and Method for Supplying Uniform Flow of Dielectric Cooling Fluid for Data Servers" filed on Sep. 14, 2022, the entire contents of which are hereby incorporated by reference for all purposes.

BACKGROUND

Data centers may be used by organizations to assemble, process, store, and disseminate large amounts of data. Many enterprises rely heavily on the applications, services and data contained within a data center, making it a critical asset for everyday operations.

A data center facility may include, for example, systems for storing, sharing, accessing, and processing data, physical infrastructure for supporting data processing and data communications, and utilities such as cooling, electricity, and network security access. Conventional data center challenges may include, for example, cooling ever-increasing heat loads; the cost of power, sustainability, and the ability to scale quickly and easily. As high-density technology continues to increase in usage, the amount of heat that is generated continues to increase. The increased heat results in pushing the computing hardware to its limit. This trend is expected to continue into the future.

Data centers typically have a significant carbon footprint. As the need for these data centers continues to surge, an increase in power usage and greenhouse gas emissions is expected to surge with the demand for data centers. Greenhouse gas emissions can contribute to extreme weather and put the health of our planet at risk. There is growing demand from both the public and industry to reduce the environmental impact of all businesses. Thus, sustainability has moved into the corporate domain and, due to regulations and the cost implications of reducing a carbon footprint, mitigation of greenhouse gas emissions and generated heat may be critical. With these economic and political pressures driving data centers to seek alternative approaches to conventional facility design, owners and operators are turning to liquid immersion cooling to reduce power use and drive sustainability efforts.

As data crypto mining evolves, the computational power of the servers (e.g., miners) continues to be pushed, requiring greater heat dissipation capability. With these pressures driving data centers to seek alternative approaches to conventional facility design. Immersion cooling is a popular and proven solution for heat dissipation to reduce power use and drive sustainability efforts. Specifically, the dielectric fluid, in which computing devices such as servers may be immersed, is a far more efficient thermal dissipator than air. In addition, immersion cooling does not require fans which means more power may be directed to the operation of the computing device (i.e., server). Thus, in terms of crypto-mining, more power may be directed to higher hash rates.

A typical crypto-mining installation may include several computing device servers (also referred to as miners) that are mounted in a single immersion cooling tank. While the immersion of the computing devices in the immersion cooling tank may promote cooling, a non-uniform flow distribution of the dielectric cooling fluid may cause inefficient heat dissipation. As a result, overheating may occur in some of the computing devices that are position away from the peak flow distribution. Computing devices that are located further away from the inlet are prone to receive a lower flow rate of the dielectric cooling fluid across them. As a result, these computing devices may be operating at increased temperatures and may possess lower than expected hash rates. However, conventional solutions such as variable duct sizes and tapered geometries can cause significant large-scale manufacturing complexities, compromising the fidelity of the proposed system. Therefore, a low-cost and low-complexity solution is required that ensures uniform flow distribution across a multi-server installation.

SUMMARY

Various aspects include devices, systems, and methods for providing uniform fluid distribution of dielectric cooling fluid to a plurality of computing devices in an immersion cooling system. Some aspects may include a tank defining an open interior volume, a distribution pipe positioned on the floor and running across the length of the tank, a distribution plate positioned over the distribution pipe, and at least one computing device mounted on the distribution plate. In some aspects, the dielectric cooling fluid may enter the open interior volume of the tank through the plurality of ports in the distribution pipe. In some aspects, the dielectric cooling fluid may flow through multiple repeated sets of the pattern of holes in the distribution plate to contact the at least one computing device. In some aspects, heat dissipates from the at least one computing device into the dielectric cooling fluid.

In some aspects, a floor of the tank may include a plurality of alternating elevated platforms and alleys. In some aspects, the distribution pipe may include a plurality of ports that each align with one of the alleys. In some aspects, the distribution plate may have a pattern of holes in multiple repeated sets. In some aspects, each of the at least one computing device may be aligned with one set of the pattern of holes.

In some aspects, the distribution pipe may be connected on one end to an inlet of the tank, and is capped on an opposite end.

Some aspects may further include a rack that may house twenty-four computing devices in the at least one tank. In some aspects, the plurality of ports may include thirteen equally spaced ports along each of two opposite sides of the distribution pipe. In some aspects, the pattern of holes in the multiple repeated sets may be twenty holes repeated twenty-four times over the distribution plate.

In some aspects, each of the plurality of ports in the distribution pipe may have an internal diameter of 10 mm, and each hole in the pattern of holes in the distribution plate may have an internal diameter of 5 mm.

In some aspects, the distribution plate may be positioned such that there is a 6.5 mm clearance gap between the top of the distribution pipe and the bottom of the distribution plate.

In some aspects, the dielectric cooling fluid may be oil. Some aspects may further include an oil-to-water heat exchanger.

In some aspects, the at least one computing device may include twenty-four servers housed in each of at least one rack within the tank.

In some aspect, the floor of the tank may include twelve elevated platforms and thirteen alleys.

Various aspects are disclosed herein that may include devices, systems, and methods for providing uniform fluid distribution of dielectric cooling fluid to a plurality of computing devices in an immersion cooling system. Some aspects may include a tank defining an open interior volume, a distribution pipe positioned on the lower portion of the tank and the distribution pipe has a plurality of ports, a distribution plate positioned over the distribution pipe, the distribution plate has a pattern of holes, a siphon wall mounted inside of the tank and extends from the floor, the siphon wall may divide the open interior volume to define a first chamber and a second chamber, and the distribution plate and the distribution pipe may be located in the first chamber, an outlet may be located on the tank along the second chamber. In some aspects, at least one computing device may be mounted on the distribution plate, the primary circuit dielectric cooling fluid may enter the first chamber of the tank through the plurality of ports in the distribution pipe, the primary circuit dielectric cooling fluid may flow through the multiple repeated sets of the pattern of holes in the distribution plate to contact the at least one computing device, and the heat may dissipate from the at least one computing device into the dielectric cooling fluid, and the dielectric cooling fluid may flow through the siphon wall into the second chamber when the surface of the dielectric cooling fluid is above the level of a transfer port and then exits the tank via the outlet.

In some aspects, the tank may have a pair of side walls and an attachment structure mounted on the floor, and siphon wall may be mounted to the floor via the attachment structure and the siphon wall may abut the pair of side walls.

In some aspects, the siphon wall may have a first edge and a second edge that are spaced away from each other, the second edge may be proximal to the floor, a plurality of transfer ports may be proximal to the first edge and located below the surface of the dielectric cooling fluid such that the plurality of transfer ports are located between the floor and the surface of the dielectric cooling fluid, and the plurality of transfer ports may be spaced away from each other. Put another way, the volume of cooling fluid that fills both the first chamber of the tank and the second chamber of the tank is configured such that the plurality of transfer ports is disposed below the fluid surface of the volume of dielectric cooling fluid.

In some aspects, the siphon wall may have an elongated transport port that is located below the surface of the dielectric cooling fluid such that the elongated transfer port is located between the floor and the surface of the dielectric cooling fluid, and the tank has a length, and the elongated transfer port may extend the length of the tank. The transfer port may provide a fluid communication channel between the first chamber of the tank and the second chamber of the tank.

In some aspects, the siphon wall may include a back wall such that a cavity may be formed between the siphon wall and the back wall. The cavity may provide a vertical fluid communication channel between a transfer port and a siphon wall outlet that is vertically spaced away from the transfer port. In some aspects, the primary circuit dielectric cooling fluid flows from the first chamber to the second chamber by flowing from first chamber of the tank through the transfer port into the cavity and through the cavity and out of the siphon outlet.

In some aspects, the siphon wall can be directly fastened to the distribution plate.

Various aspects include devices, systems, and methods for providing uniform fluid distribution of cooling fluid to a plurality of computing devices in an immersion cooling system. Some aspects may include distributing primary circuit dielectric cooling fluid into a first chamber of a tank through a first set of a plurality of holes in a distribution pipe and a second set of a plurality of holes in a distribution plate, the first set and second set of the plurality of holes may be aligned, flowing the primary circuit dielectric cooling fluid onto at least one computing device, and the at least one computing device may be mounted on the distribution plate. In some aspects, dividing the tank into the first chamber and a second chamber with a siphon wall, the siphon wall has at least a transfer port, passing the primary circuit dielectric cooling fluid from the first chamber to the second chamber through the transfer port of the siphon wall, and sending the primary circuit dielectric cooling fluid out of the tank via an outlet located in the second chamber.

BRIEF DESCRIPTION OF THE DRAWINGS

The accompanying drawings, which are incorporated herein and constitute part of this specification, illustrate exemplary embodiments of the claims and together with the general description given above and the detailed description given below, serve to explain the features of the claims.

DETAILED DESCRIPTION

Figure 1A:
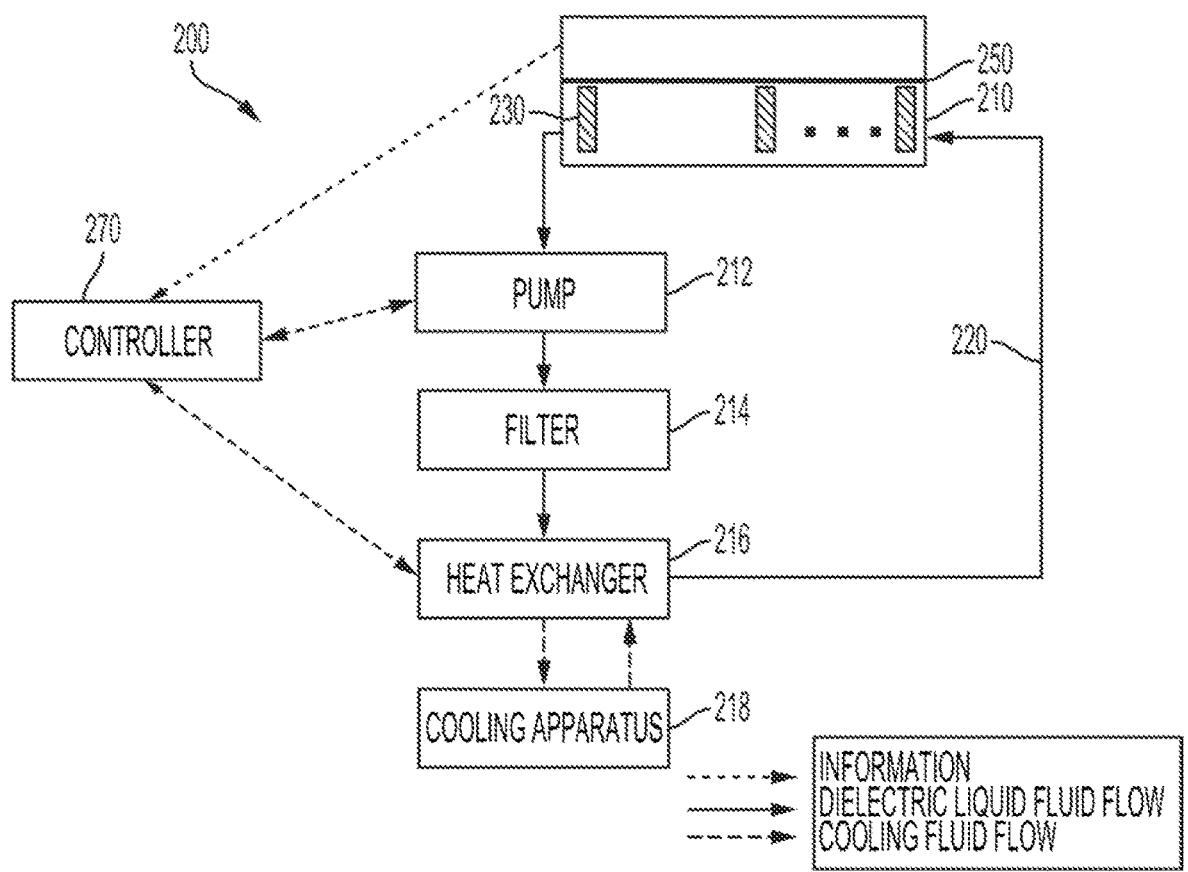
FIGS. 1A and 1B are schematic diagrams of example systems for cooling one or more computing devices in accordance with various embodiments.

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

Immersion cooling racks, in accordance with various embodiments provide a pool of dielectric cooling fluid in a tank. The dielectric cooling fluid may be circulated in the tank such that heat may be rejected from the heated dielectric cooling fluid to the atmosphere (typically via an external cooling device such an evaporative cooling tower) and cooled dielectric cooling fluid may then be delivered to the heat-generating electronic components that would otherwise overheat.

As dielectric cooling fluid interacts with computing devices, the dielectric cooling fluid may absorb portions of the heat that is generated by the operating computing devices. The absorbed heat may warm the dielectric cooling fluid. As the dielectric cooling fluid warms, the dielectric cooling fluid becomes less effective as a cooling agent. Thus, there is a desire to transport the warmed dielectric cooling fluid into a reservoir and then subsequently out of the tank, so that the warmed dielectric cooling fluid may be cooled and re-introduced into the tank. There are various methods for distributing the flow of the dielectric cooling fluid.

Siphon walls are a method of distributing the flow of the dielectric cooling fluid that may result in reduced wear and tear as well as maintenance requirements. Siphon walls may be modular and scaled to fit a variety of embodiments. Thus, siphon walls may be adaptable to different fluid source configurations. Siphon walls utilize minimal active mechanical interactions in which energy can be lost due to friction, siphon walls may be very efficient to transfer energy.

Various embodiments disclosed herein provide for systems and methods for ensuring a uniform flow distribution of the cooled dielectric cooling fluid through the immersion tank configured to house multiple computing devices. Such systems may provide the uniform flow distribution without varying the size of a distribution pipe (sometimes referred to as a duct). Rather, the systems and methods of various embodiments operate through an optimum ratio of outlet and inlet surface areas of a distribution pipe and distribution plate in order to attain sufficient back pressure for uniform flow. The various embodiments may also include a siphon wall that provides for the transport of dielectric cooling fluid that has absorbed heat generated from the multiple computing devices for cooling and subsequent re-cycling into the immersion tank.

Components of the cooling system may be scalable to different form factors and input variables. In particular, a change in the number of computing devices, power rating, distribution pipe clearance, and inlet flow rate may require the number and diameter of the holes in the distribution pipe and in the distribution plate to be adjusted accordingly. In various embodiments, the hole pattern on the distribution plate may be adjusted based on the particular type and layout of the computing device(s) being used.

Dielectric immersion cooling systems for use in various embodiments may include at least one rack, independently operable computing devices (e.g., servers) configured to be inserted into the rack vertically, and primary flow of dielectric cooling fluid through the rack, with heat removal through a secondary flow of water or other cooling fluid loop.

The terms "dielectric cooling fluid" and "oil" may be used interchangeably herein to refer to any single-phase dielectric cooling fluid, including but not limited to, a mineral oil or a synthetic derivative thereof.

The term "water" as used herein refers to water or a water mix, such as water and glycol mix commonly used in combination with a chiller or dry cooler, or water and chemical mix, such as commonly used in direct cooling of water by a cooling tower. As will be understood by one of ordinary skill in the art, water is merely an example of one secondary circuit cooling fluid according to various embodiments, and is not intended to be limiting.

FIG. 1A is a schematic block diagram that illustrates a system 200 for cooling one or more rack-mountable computing devices 230. The rack-mountable computing device may include at least one computing device 230, arranged in one or more rack, for example, in a data center. A data center in various embodiments may be a physical location housing one or more computing devices. While a rack according to various embodiments may be a frame or enclosure that contains multiple mounting slots, each designed to hold a hardware unit. In various embodiments, the hardware unit may represent any equipment module, such as a server, computing device, crypto-miner, network router, hard-drive arrays, data acquisition equipment, etc.

Figure 1B:
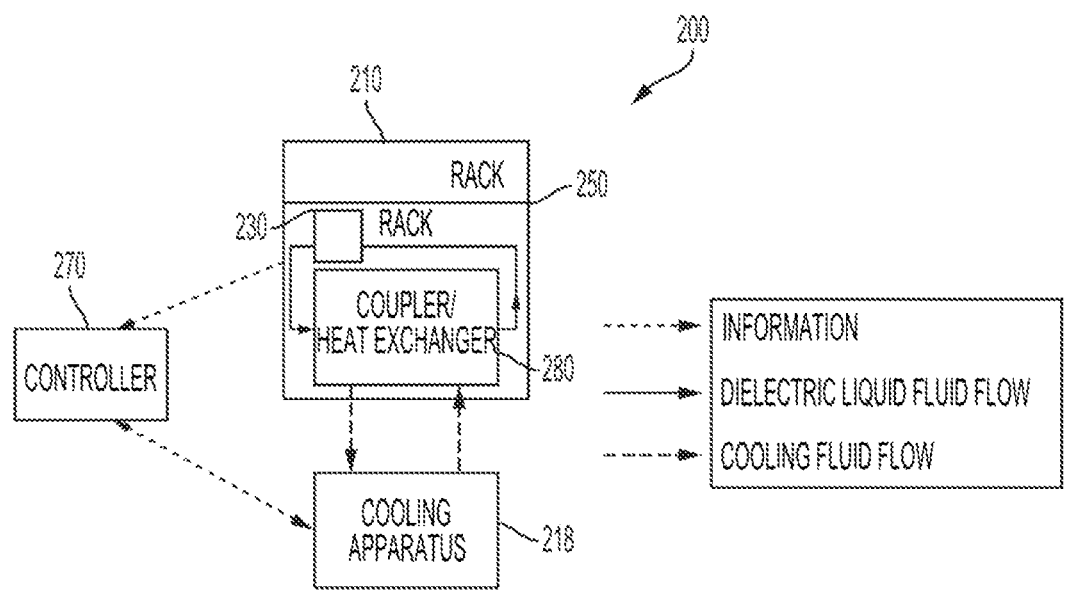

As shown in FIGS. 1A-1B, a system 200 may include an immersion tank 210 (also referred to as simply the "tank") having an interior volume containing a volume of primary circuit dielectric cooling fluid, which has a surface 250. Mounting members or rails (but not limited to such, can include those known in the art) may be positioned within the interior volume of the tank 210 and configured to receive and mount a plurality of computing devices 230 into the tank 210. In embodiments in which the computing devices 230 are servers, at least a portion of each computing device 230 may be submerged within the dielectric cooling fluid in order to sufficiently cool each respective computing device 230 when the tank 210 is sufficiently full of the primary circuit dielectric cooling fluid. Preferably, each such computing device 230 during operation is below surface 250 of the primary circuit dielectric cooling fluid.

In some embodiments, the hardware units mounted in the tank 210 may include at least one hard disk drive (HDD) (not shown). Since some HDDs are not encased in a sealed enclosure, such components may be damaged by submersion in the primary circuit dielectric cooling fluid. Therefore, mounting members may be designed such that when the HDDs are mounted thereon, the HDDs remain above the surface 250 of the primary circuit dielectric cooling fluid in the tank 210. In other embodiments, some HDDs may be sealed units and filled with helium such that the sealed HDDs may be mounted below the surface of the dielectric cooling fluid.

The primary circuit dielectric cooling fluid may absorb heat that is generated by the computing devices 230. The primary circuit dielectric cooling fluid may be fluidly coupled through suitable piping or lines to a pump 212. The pump 212 pumps the primary circuit dielectric cooling fluid, which has absorbed heat that has been generated by the computing devices 230, through suitable piping or lines to a heat exchanger 216. The heat exchanger 216 may be associated with a heat-rejection or cooling apparatus 218. Before getting to the heat exchanger 216, however, the primary circuit dielectric cooling fluid may pass through a filter 214 to filter out any foreign material that may have entered into the primary circuit dielectric cooling fluid.

The heat exchanger 216 may reject the heat that is absorbed in the incoming dielectric cooling fluid, and fluidly couple the cooled primary circuit dielectric cooling fluid through a return fluid line or piping 220 back into the tank 210. The heat rejected from the heated primary circuit dielectric cooling fluid through the heat exchanger 216 may then be selectively used by alternative heat rejection or cooling apparatus 218 to dissipate, recover, or beneficially use the rejected heat depending on different environmental conditions and/or computing system operating conditions to which the system 200 is subjected.

Either or both the heat exchanger 216 and the cooling apparatus 218 may be local or remote to the cooling system 200. The system 200 may also include a controller 270 with software for implementing the methods according to various embodiments. The controller 270 may receive monitoring signals of various operational parameters from components of the cooling system 200 as well as the environment. The controller 270 may generate control signals to control various components of the cooling system 200 in order to sufficiently cool the computing devices 230. Particularly, the controller 270 may monitor the temperature of the primary circuit dielectric cooling fluid in at least one location within the fluid circuit, for example where the heated primary circuit dielectric cooling fluid exits the plurality of computing devices 230 and heat conductive extensions.

The controller 270 may also monitor the temperature of the heat generating electronic components in the computing devices 230 by electrically connecting the controller 270 to the diagnostic output signals generated by conventional rack-mountable computing devices.

The controller 270 may also monitor the flow of the primary circuit dielectric cooling fluid. Based upon such information, the controller 270 may output control signals to the pump 212 and heat rejection or cooling apparatus 218 to adjust the flow of the primary circuit dielectric cooling fluid through the fluid circuit and the amount of the heat being rejected by the heat rejection or cooling apparatus 218.

FIG. 1B illustrates an alternative configuration for a system 200 for cooling one or more rack-mountable computing devices 230. With reference to FIG. 1B, the system 200 may be configured for cooling one or more computing devices 230, such as a server. The computing devices 230 may be arranged in one or more racks in a data center.

The system 200 includes a tank 210 having an interior volume containing a primary circuit dielectric cooling fluid. The primary circuit dielectric cooling fluid has a surface 250. The computing devices 230 may be mounted inside the tank 210 using mounting members.

The flow circuit of the primary circuit dielectric cooling fluid may be internal to the tank 210. A thermal coupling device 280, such as a heat exchanger, may be mounted within the tank 210 and the fluid circuit passes over the computing device 230, so that at least a portion of the heat generated by the computing devices 230 may be absorbed by the primary circuit dielectric cooling fluid that flows through the thermal coupling device 280. Cooled primary circuit dielectric cooling fluid exits the coupling device 280 and at least a portion of the cooled primary circuit dielectric cooling fluid circulates in the internal fluid circuit back through the computing devices 230 and the heat conductive extensions.

The system 200 in FIG. 1B includes a secondary heat rejection or cooling apparatus 218 having a secondary cooling fluid, such as a gas or liquid flowing in piping or lines, forming a second fluid circuit. The secondary cooling apparatus 218 may include an associated heat exchanger (not shown) t to reject heat from the primary circuit dielectric cooling fluid in the secondary fluid circuit. The heat rejected from the heated primary circuit dielectric cooling fluid in the secondary fluid circuit through the heat exchanger 280 associated with the secondary cooling apparatus 218 may then be selectively dissipated, recovered, or beneficially used depending on the different environmental conditions and/or computing system operating conditions to which the system is subject.

The system 200 may include a controller 270 that may receive monitor signals of various operational parameters from various components of the cooling system 200 and the environment. The controller 270 may generate control signals to control various components of the cooling system 200 to maintain the heated primary circuit dielectric cooling fluid exiting the computing devices 230 in the tank 210 at a specific temperature. In this manner, each of the plurality of computing devices 230 may be sufficiently cooled while reducing the total amount of energy needed to cool the computing devices 230.

The controller 270 may monitor the temperature of the primary circuit dielectric cooling fluid at least one location within the internal fluid circuit, for example, where the heated primary circuit dielectric cooling fluid exits the computing devices 230 immersed in the tank 210. The controller 270 may also monitor the temperature of the heat-generating electronic components in the computing devices 230 by electrically connecting the controller to the diagnostic output signals generated by conventional rack-mountable computing systems.

The controller 270 may also monitor the flow and temperature of the primary circuit dielectric cooling fluid in the external fluid circuit. Based upon such information, the controller 270 may output signals to the heat rejection or cooling apparatus 218 to adjust the flow of the primary circuit dielectric cooling fluid through the external fluid circuit and the amount of the heat being rejected by the heat rejection or cooling apparatus 218 for sufficiently cooling each respective computing devices 230 while maintaining the heated primary circuit dielectric cooling fluid exiting the computing systems and heat conductive extensions at the specific temperature to reduce the amount of energy consumed to sufficiently cool each of the computing devices 230.

By maintaining the existing primary circuit dielectric cooling fluid at an elevated level, the cooling system may be used with a number of different techniques for using or dissipating the heat (e.g., heat recapture, low power heat dissipation, or refrigeration).

Figure 2:
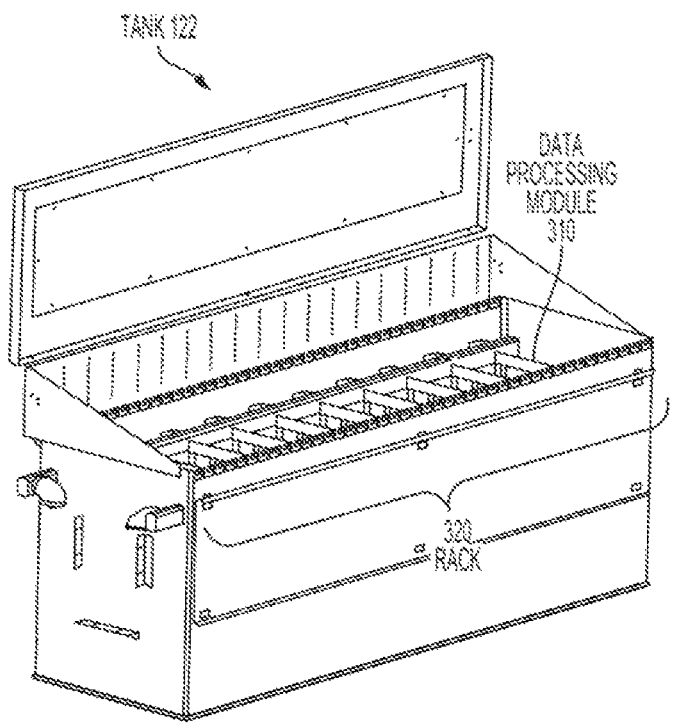
FIG. 2 is an isometric view of a tank for use in accordance with various embodiments.

FIG. 2 illustrates a tank 122 in an example immersion cooling system that may be used in various embodiments. With reference to FIGS. 1A-2, components of each rack-mounted computing device 230 (e.g., server) may generate heat within a rack 320. The heat from the rack may be dissipated in a primary circuit dielectric cooling fluid in which it is submerged in the rack 320, such as oil. The heated primary circuit dielectric cooling fluid may exit the rack 320 and/or the tank 122, and may be pumped to a heat exchanger 280 (e.g., a dielectric cooling fluid-to-water heat exchanger). The heat exchanger 280 may pass the heat from the primary circuit dielectric cooling fluid to a heat removal system, and the primary circuit dielectric cooling fluid may return to the rack 320. The heat removal system may cause the heat captured heat to be expelled or reused, after which the cooled secondary cooling fluid (i.e., water or a water/glycol mixture) may be returned to the heat exchanger 280.

The tank 122 may optionally have a hinged or removable lid, or an open top. The tank 122 may be fabricated of steel, a sufficiently strong plastic that is compatible with the liquid coolant used as a cooling medium, or other suitable material. The tank 122 may contain a plurality of independently operable data processing modules 310 (e.g., computing devices) mounted vertically. Each data processing module 310 may be independently removable and replaceable without affecting the position or operation of other data processing modules. The independently operable data processing modules 310 may be mounted in an array that is arranged horizontally on a rack, and immersed at least partially in a dielectric cooling fluid.

Figure 3:
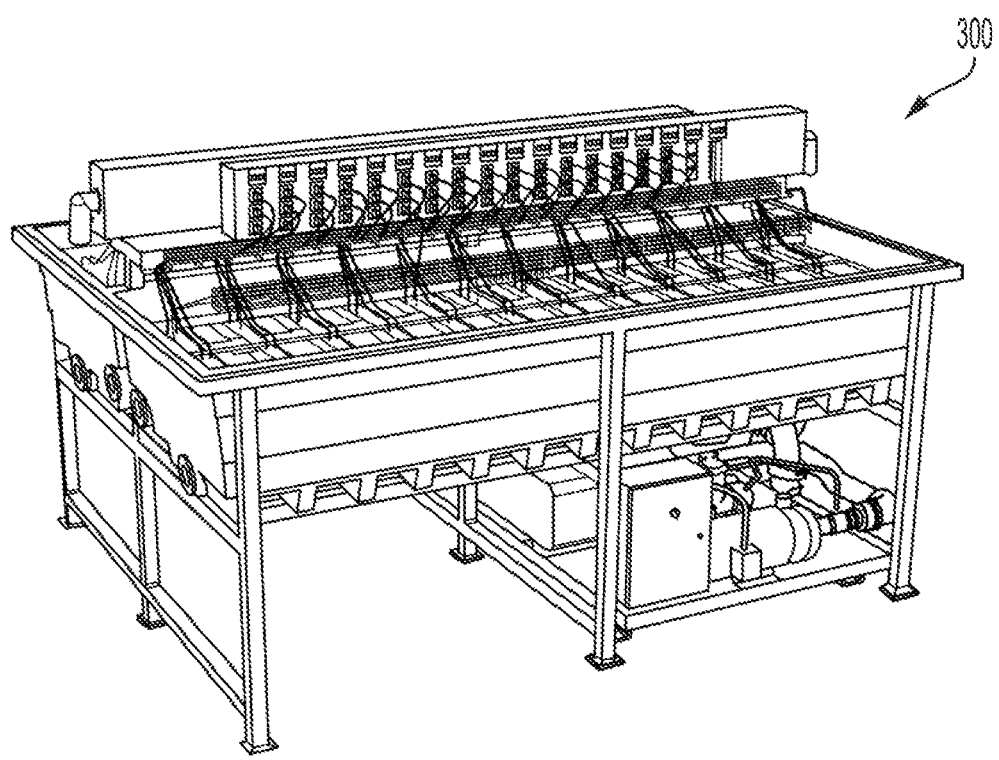
FIG. 3 illustrates an example immersion cooling system for a plurality of computing devices in accordance with various embodiments.

FIG. 3 illustrates another immersion cooling system according to various embodiments. With reference to FIGS. 1A-3, system 300 may include one or a plurality of power distribution units (PDUs), and may be capable of supporting two racks 320 and up to forty-eight (48) computing devices 230 (e.g., servers). Although a greater or fewer number of computing devices may be supported. In various embodiments, twenty-four (24) computing devices 230 may be housed in each rack. Although a greater or fewer number of computing devices may be housed in each rack. The system 300 may include a frame made of low-profile metal tubes engineered for strength, and may hold a cooling distribution unit (CDU) under the rack(s), providing easy access to components and a minimal footprint.

In various embodiments, the system 300 may also include a monitoring system that checks coolant pressure, temperatures, and levels to ensure efficient operation, and that identifies faults in order to maximize uptime. For example, embodiment systems may be configured with one or more sensors to monitor various parameters and detect conditions associated with failure modes. In particular, such conditions may include that the temperature and/or conductivity of the primary circuit dielectric cooling fluid in the rack is too high, that the fluid volume in the rack is too high, or that the pressure of water in the circuit supplying water to an oil-to-water heat exchanger is too low.

In order to supply a uniform distribution of primary circuit dielectric cooling fluid to all of the computing devices (e.g., servers) in a tank, the various embodiment systems may include a distribution pipe that is enclosed on top by a distribution plate having a plurality of strategically located holes. In various embodiments, the floor 401 of the tank may have an alternating pattern elevated platforms 402 and depressed alleys 404. For example, the size and/or location of the plurality of strategically located holes in the distribution plate 700 may be configured to optimize the flow of coolant based on the specific types and number of computing devices 230, 310 housed in the rack 320.

Figure 4A:
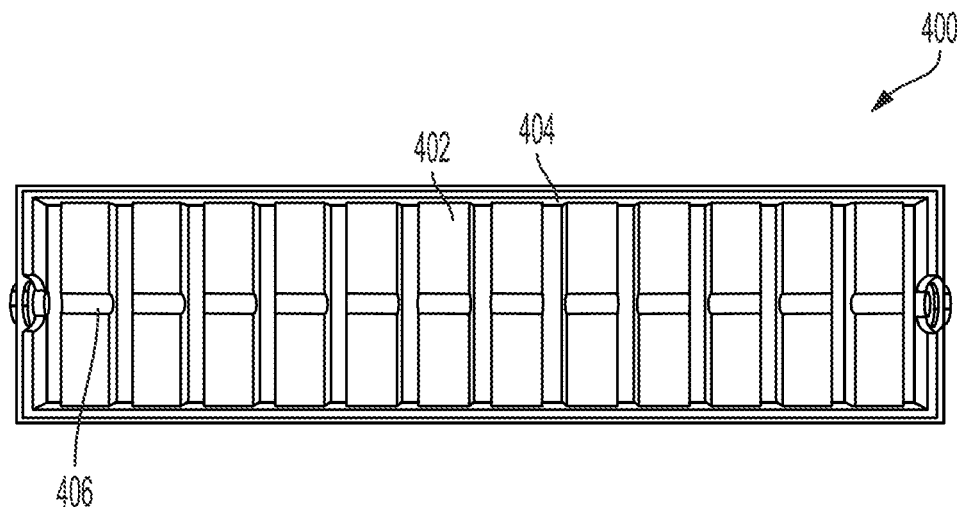
FIGS. 4A and 4B are top and isometric views of an example tank of a multi-computing device immersion cooling system in accordance with various embodiments.
Figure 4B:
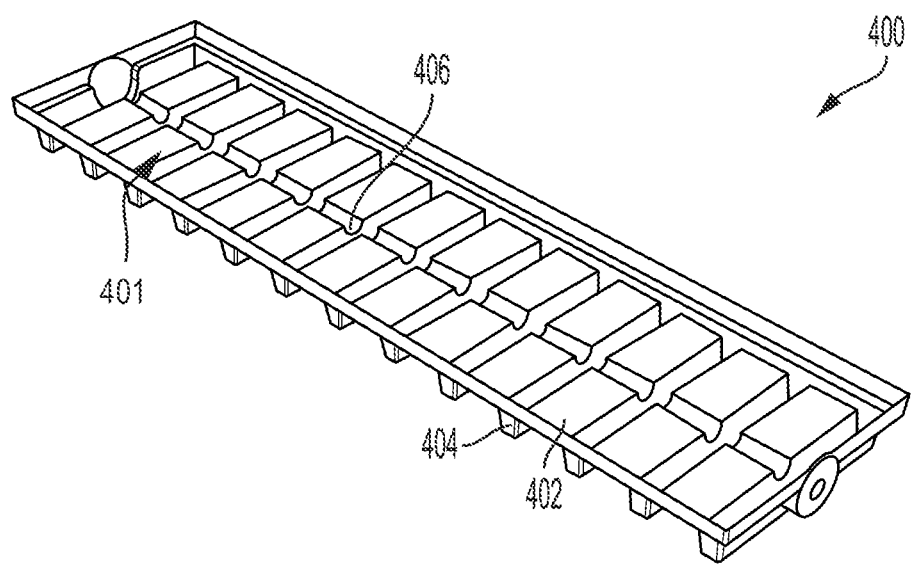

FIGS. 4A and 4B show a portion of a tank according to various embodiments. With reference to FIGS. 1A-4A, the portion of the tank 400 has a floor 401 that includes twelve alternating elevated platforms 402 and thirteen depressed alleys 404. In various embodiments, a duct 406 in the middle of the floor 401 of the tank interior is configured to receive a distribution pipe 500 which may be connected to an inlet of the tank 400 at one end. The configuration of the tank 400 is merely an example, and is not intended to be limiting. Other configurations, such as those including more or less elevated platforms and/or valleys, etc. may be substituted for the example configuration of the tank 400, and other configurations are in accordance with the various embodiments. The tank 400 may be thermally formed using a polycarbonate thermal vacuum process. However, other processes and materials may be used to form the tank 400.

Figure 5:
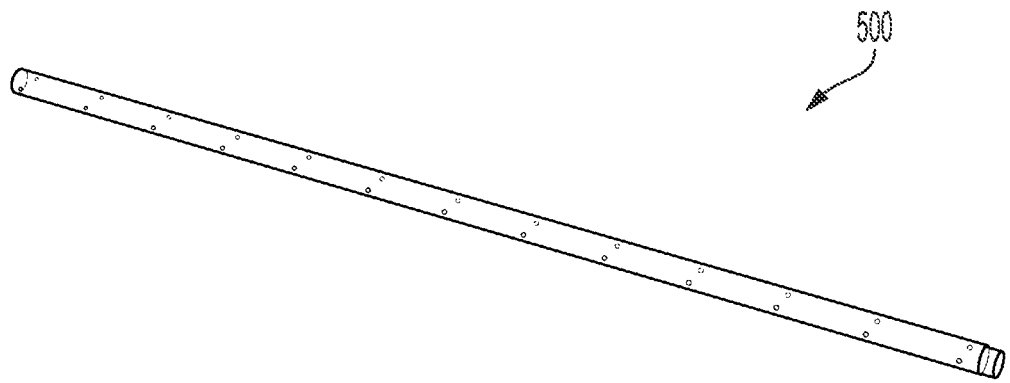
FIG. 5 is an isometric view of an example distribution pipe for use in a multi-computing device immersion cooling system in accordance with various embodiments.

In various embodiments, the distribution pipe 500 may run across the interior of the tank 400, and may be capped at the opposite end of the connection to the tank inlet. FIG. 5 illustrates a distribution pipe according to various embodiments. With reference to FIGS. 1A-5, the distribution pipe 500 may have a plurality of equally spaced ports, each having a fixed internal diameter.

In some embodiments, the internal diameter of the ports in the distribution pipe 500 may be 10 mm. In some embodiments, the distribution pipe 500 may have twenty-six total ports, with thirteen on each side (i.e., in each direction facing the depressed alleys (e.g., 404)). In various embodiments, the number and placement of the ports in the distribution pipe 500 may be configured to match the depressed alleys 404 in the tank 400, such as providing two ports per alley 404.

The configuration of the distribution pipe 500 is merely an example and is not intended to be limiting. Other configurations, such as those including more or less ports, or ports of different sizes and/or placements, etc. may be substituted for the example configuration of the distribution pipe 500, and other configurations are in accordance with the various embodiments.

Figure 6:
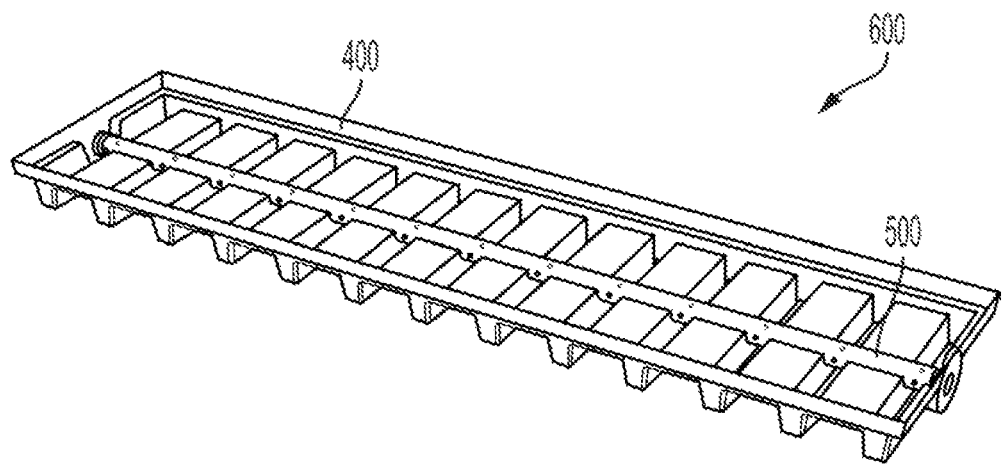
FIG. 6 is an isometric view of the example distribution pipe of FIG. 5 installed in the example tank of FIGS. 4A and 4B in accordance with various embodiments.

FIG. 6 illustrates a distribution pipe 500 installed in a tank 400 according to various embodiments. With reference to FIGS. 1A-6, system 600 includes the tank 400 and the distribution pipe 500, which is connected to the inlet port of the tank 400 on one end and capped on the other end.

In various embodiments, an immersion cooling system may also include a distribution plate. With reference to FIGS. 1A-7, the distribution plate 700 may be positioned in the tank 400 to enclose an interior volume around the distribution pipe 500. In some embodiments, the distribution plate 700 may be perforated to include multiple holes, which may be positioned in a pattern that is repeated. For example, in some embodiments the distribution plate 700 may be configured with holes having an equally-sized internal diameter of 5 mm. For example, the pattern 702 may be twenty (20) holes, configured as a block of eighteen (18) holes with two (2) holes spaced further apart to the side. In some embodiments, the distribution plate 700 may have a total number of four hundred eighty (480) holes, such as twenty-four (24) repeated sets of the pattern 702. In some embodiments, the holes in the distribution plate 700 may have equally sized internal diameters, while in other embodiments the holes may have internal diameters of unequal sizes.

In various embodiments, a plurality of computing devices 230 (e.g., servers) may be mounted over the distribution plate 700 in the tank, and the repeating patterns of holes 702 may be configured to align with the computing devices 230. For example, in some embodiments, each repeating pattern 702 of twenty (20) holes may correspond to a computing device 230, with the two (2) holes on the side positioned to a power supply of a computing device 230, and the remaining eighteen (18) holes positioned to align with the rest of the computing device 230. In some embodiments, the twenty-four (24) repeating sets of the pattern 720 may match the twenty-four (24) computing devices 230 that may be mounted in the tank 400. As shown in FIG. 8B, the twenty-four (24) repeating sets of the pattern 720 may form a two by twelve (2×12) array arranged to provide a uniform flow distribution of primary circuit cooling fluid over and across twenty-four (24) mounted computing devices 230. In other embodiments, the repeating sets of the pattern 720 may form other dimensioned arrays, such as a one by twenty-four (1×24), three by eight (3×8), four by six (4×6) array. In the various embodiments that are configured with varying arrays, the size of ports and perforated holes may vary to provide the uniform flow distribution.

The configuration of the distribution plate 700 is merely an example, and is not intended to be limiting. Other configurations, such as those including more or less holes, and/or different patterns, sizes, or placements of holes, etc. may be substituted for the example configuration of the distribution plate 700, and other configurations are in accordance with the various embodiments.

Figure 7:
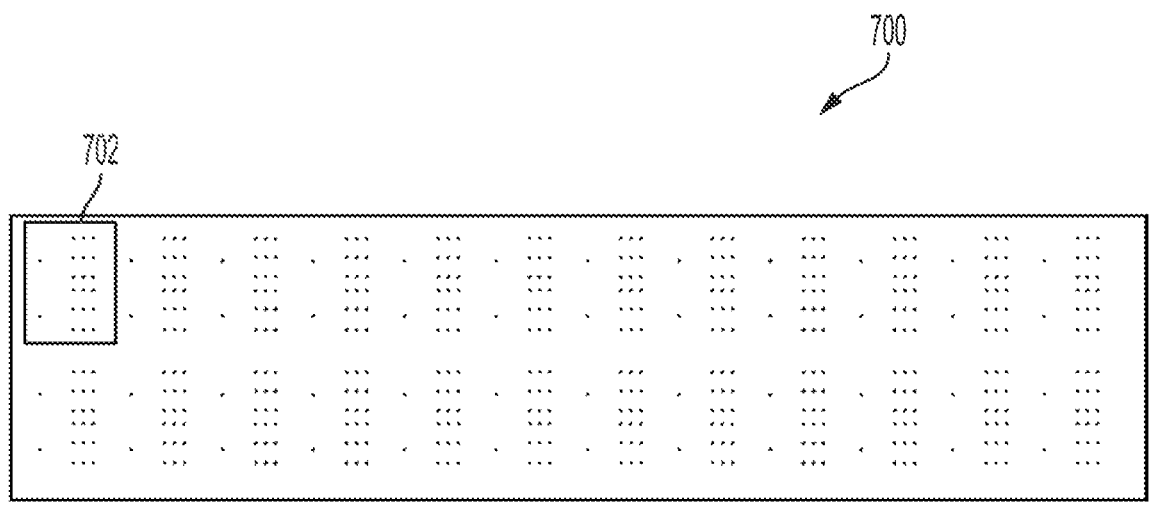
FIG. 7 is an illustration of a distribution plate for use in a multi-computing device immersion cooling system in accordance with various embodiments.
Figure 8A:
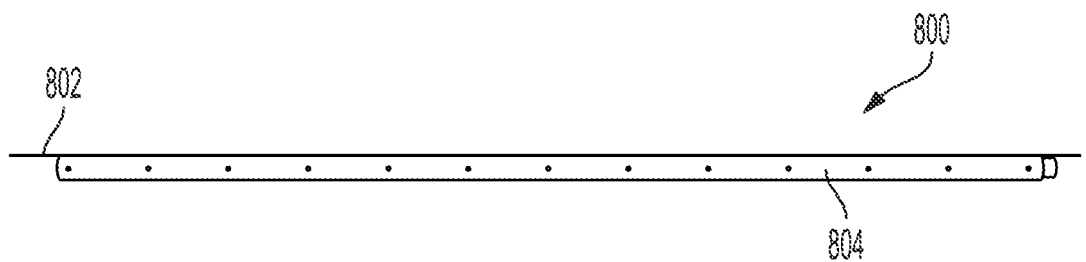
FIGS. 8A-8C are top and side views of an example distribution pipe and distribution plate in a tank of a multi-computing device immersion cooling system in accordance with various embodiments.
Figure 8B:
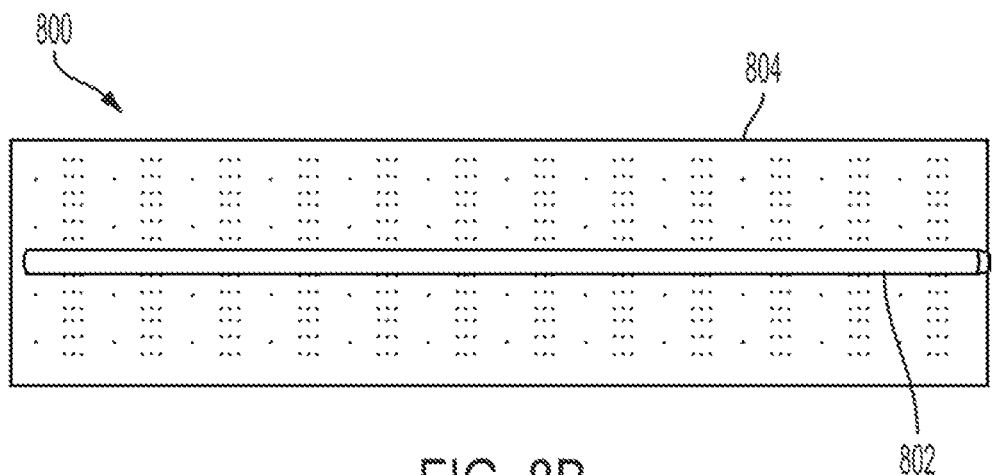
Figure 8C:
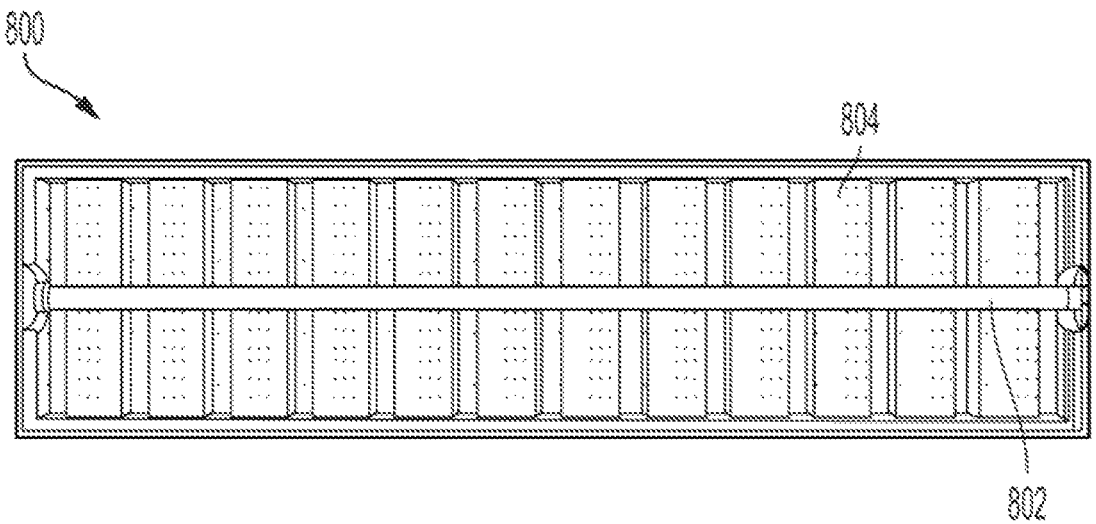

As shown in FIG. 8A, there may be a small clearance gap between the distribution pipe and the distribution plate according to various embodiments. With reference to FIGS. 1A-8C, the system 800 may include a clearance gap of 6.5 mm between the distribution pipe 500, 802 and the distribution plate 700, 804 within the tank 400.

In various embodiments, the primary circuit dielectric cooling fluid may enter the system 800 through the distribution pipe 500 and may flow into the interior of the tank 400 through ports in the distribution pipe 500. In various embodiments, the primary circuit dielectric cooling fluid exiting the ports may flow directly into the alleys (e.g., 404) of the tank 400 floor 401.

Such ports may have an interior diameter of, for example, 10 mm. In various embodiments, the primary circuit dielectric cooling fluid may fill the alleys 404 and the interior volume of the tank 400, and may eventually pass through the holes in the distribution plate 700 to surround the casings of the computing devices 230 mounted in the tank (not shown in FIGS. 8A-8C).

By pumping the primary circuit cooling fluid through the distribution pipe 500, the ports in the distribution pipe 500, into the alleys 404 and up through the pattern of holes in the distribution plate 700, the various embodiments may be designed to achieve a total inlet mass flow rate of 3.95 kg/s per tank at 40° C. inlet temperature. Such inlet flow rate may ensure efficient heat dissipation in a 6 kW server. Computation fluid dynamics (CFD) methodology demonstrates that flow is well distributed and uniform throughout the various positions along the distribution plate 700, with a mean of 0.165 kg/s and a standard deviation of 0.010 kg/s. In a laboratory setting for verification, the experimental dataset had a mean of 0.161 kg/s and a standard deviation of 0.011 kg/s.

Pressure at the outlet ranged from 88 Pa to 116 Pa with a mean of 102 Pa and a standard deviation of 9 Pa. Minimum and maximum velocities at the outlet were 0.41 m/s and 0.48 m/s, respectively, with a mean of 0.45 m/s and a standard deviation of 0.025 m/s.

The tank 400 is scalable to different form factors and input variables. A change in the number of computing devices (miners), power rating, distribution pipe clearance, and inlet flow rate would require the number and diameter of the holes on the distribution pipe 500 and distribution plate 700 to be adjusted accordingly. The hole pattern 702 on the distribution plate 700 in the embodiment disclosed above may be set for a specific type of miner. The hole pattern 702 can also be modified to suit a particular miner layout.

Figure 9:
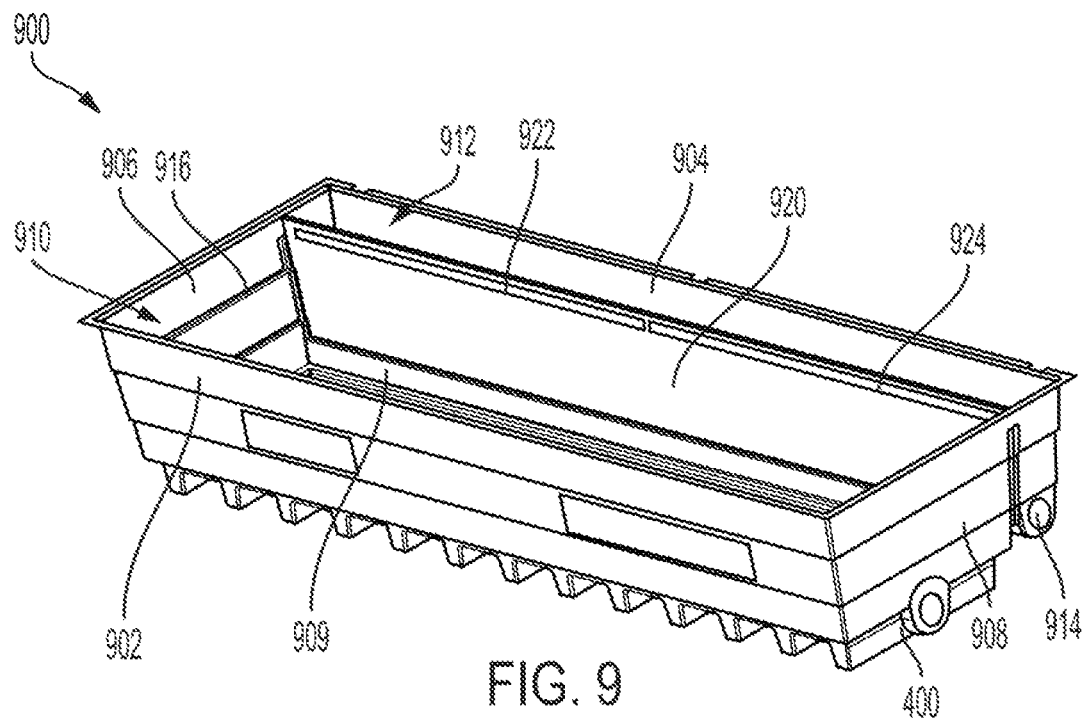
FIG. 9 is a top perspective view of an example system for use in a multi-computing device immersion cooling system in accordance with various embodiments.

FIG. 9 illustrates an embodiment system 900 includes the tank 400. The tank may have an elongated front wall 902 and rear wall 904 that are attached to each other by a first side wall 906 and a second side wall 908. The walls 902, 904, 906, 908 may extend upward from a bottom surface. The walls 902, 904, 906, 908 may include a plurality of continuous ridges 916 that are vertically spaced away from each other. In some embodiments, the continuous ridges may provide support for components such as a siphon wall 920.

Figure 12:
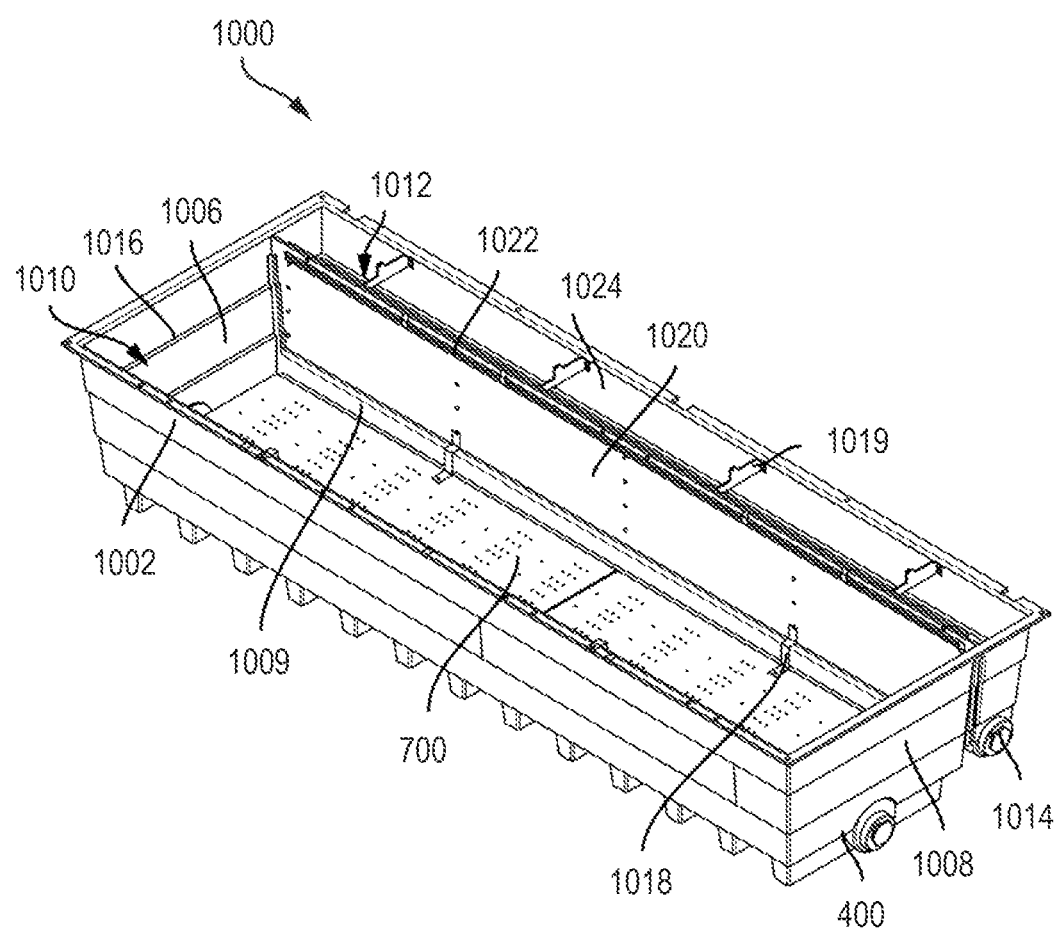
FIG. 12 is a top perspective view of an example alternative embodiment of the system of FIG. 9 for use in a multi-computing device immersion cooling system in accordance with various embodiments.
Figure 14:
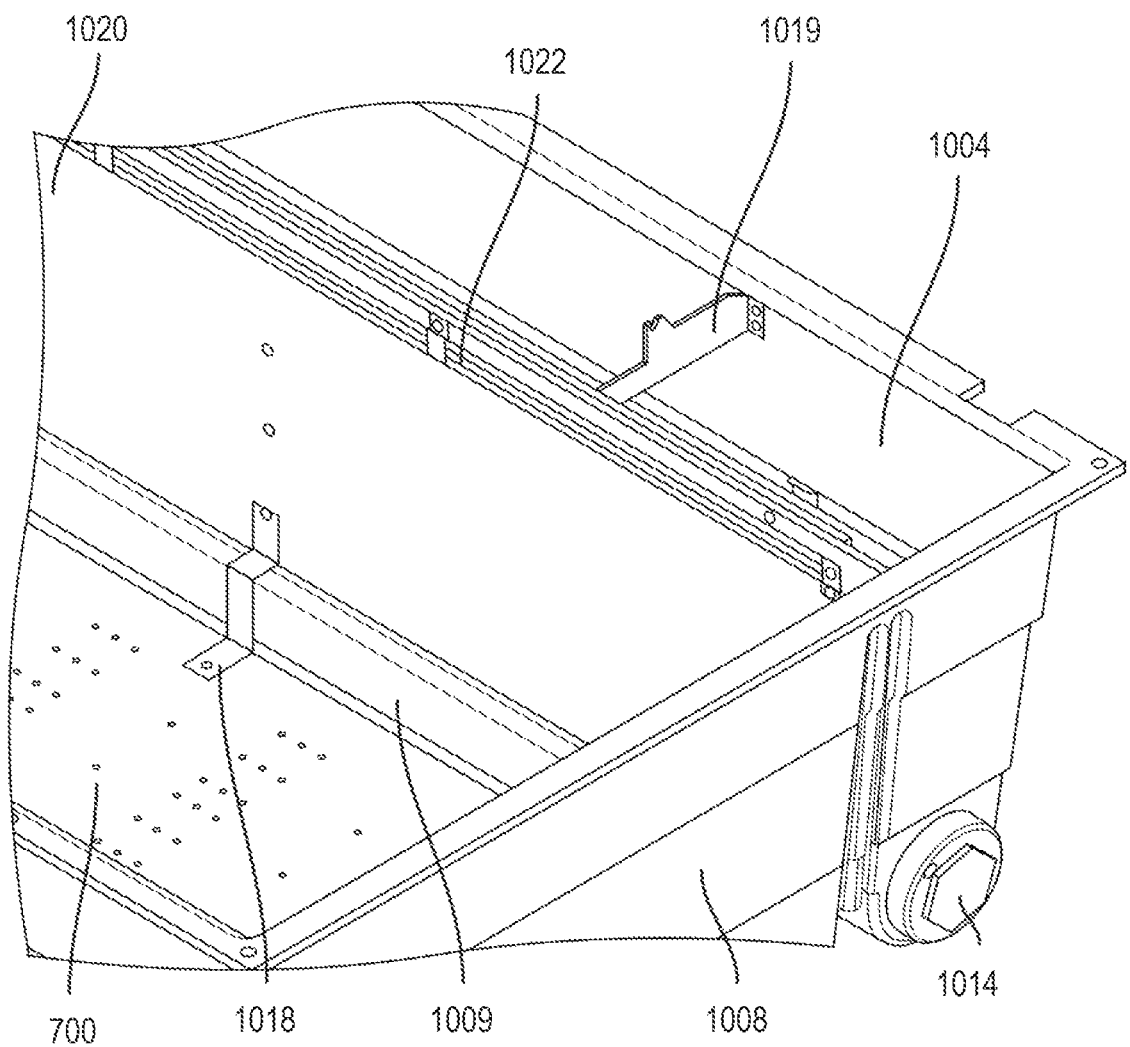
FIG. 14 is a top perspective view of a portion of the example system of FIG. 12 in accordance with various embodiments.

The walls 902, 904, 906, 908 may surround the distribution plate 700 (see FIGS. 7, 12, and 14). A base attachment 909 may be mounted to both side walls 906, 908 and extends across a length of the tank 400. The base attachment 909 may be proximal to the distribution plate 700. In various embodiments, a siphon wall 920 may be mounted to the base attachment 909. In other embodiments, the siphon wall 920 may be directly attached to the side walls 906, 908.

Figure 10:
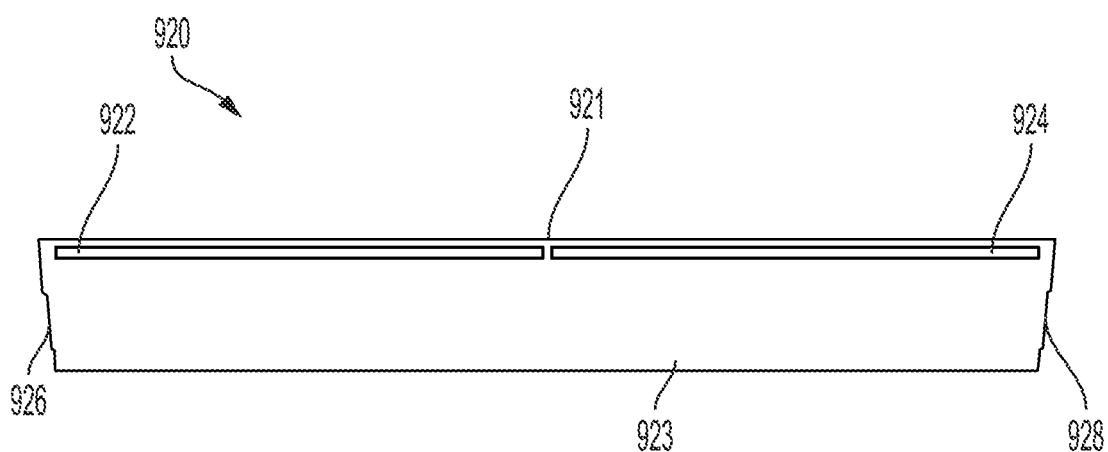
FIG. 10 is a front view of an example siphon wall according to the system of FIG. 11 in accordance with various embodiments.
Figure 11:
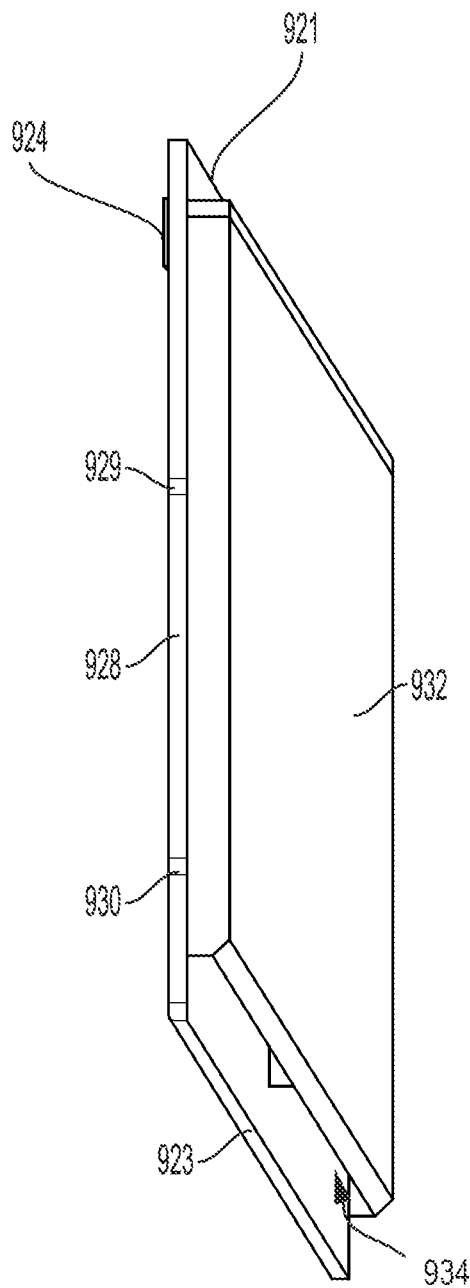
FIG. 11 is a back perspective view of the example siphon wall of FIG. 10 according to the system of FIG. 9 in accordance with various embodiments.
Figure 13:
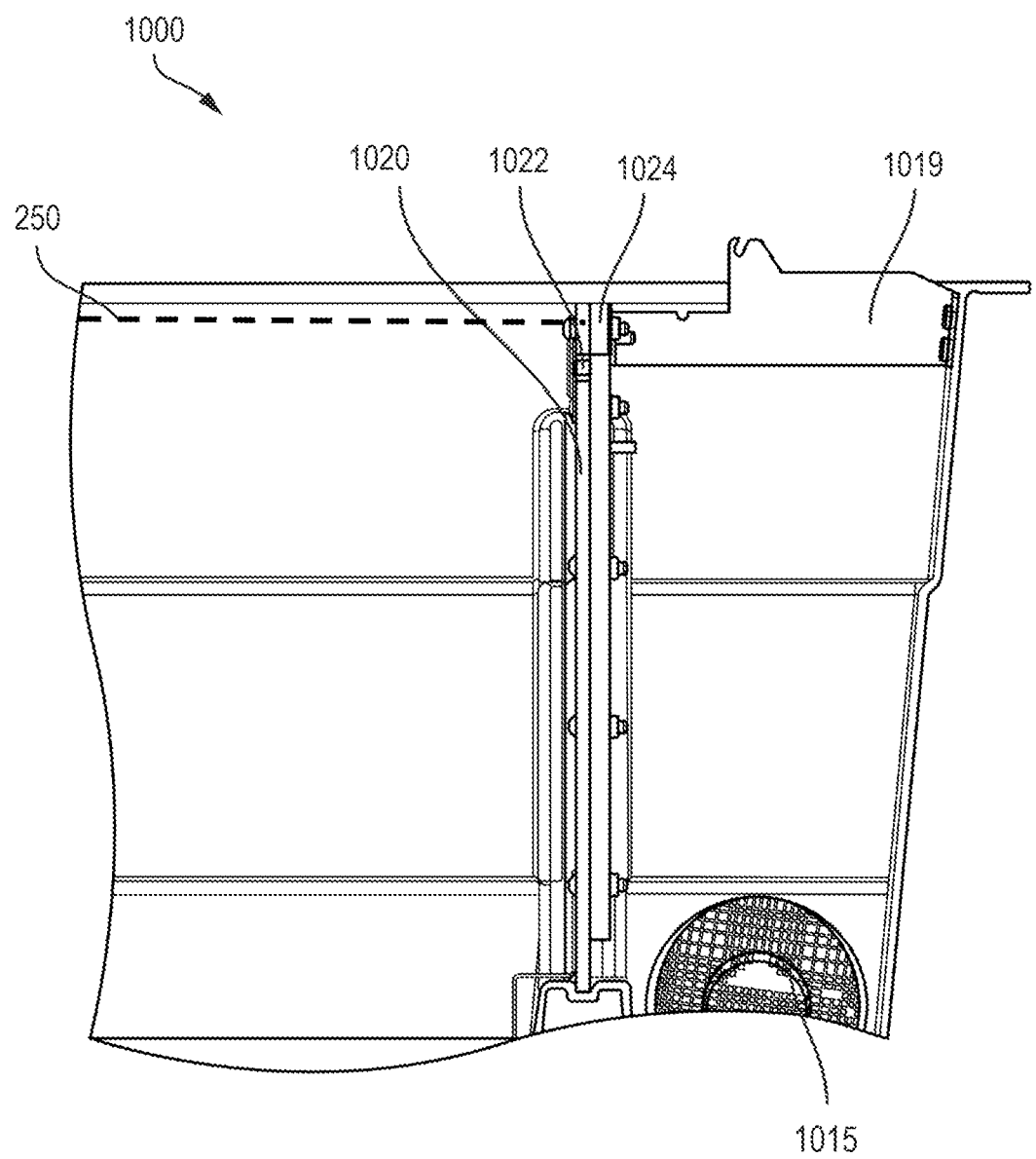
FIG. 13 is a cross-sectional side view of a portion of the example system of FIG. 12 with a modification in accordance with various embodiments.

Referring to FIGS. 10 and 11, in various embodiments, the siphon wall 920 may have a top edge 921, a bottom edge 923, a first side edge 926, and a second side edge 928. The side edges 926, 928 each have a first step 929 and a second step 930 that may be vertically spaced away from each other. The steps 929, 930 may be used to mount the siphon wall 920 into the side walls 906, 908. For example, in some embodiments, steps 929 and 930 may engage with continuous ridges 916 to mount the siphon wall 920 within the tank. The siphon wall 920 may include a back wall 932 that is mounted to a back side of the siphon wall 920. The back wall 932 may be distal from the siphon wall 920. The back wall 932 extends from the side edges 926, 928 of the siphon wall 920, and the back wall 932 is spaced away from the top edge 921 and the bottom edge 923. During attachment, the back wall 932 is directly adjacent to the base attachment 909. In an exemplary embodiment, as shown in FIGS. 11 and 13, the back wall 932 may form a chamber for a cavity 1024. The cavity 1024 may be formed along the back wall 932. With reference to FIGS. 9-14, the transfer port (922, 924, 1022) may be defined by a continuous perimeter. In various embodiments all edges of the continuous perimeter may be located substantially below the fluid surface 250 of the volume of dielectric cooling fluid that fills the tank 900, 1000. In these exemplary embodiments, the fluid is transferred through the siphon wall 920, 1020 when the dielectric cooling fluid surface 250 is higher than the transfer ports (922, 924, 1022). In this manner a positive pressure may be exerted to transport dielectric cooling fluid that has absorbed heat generated by the computing devices 230, 310 in the first chamber 910 of the tank into a second chamber 912 of the tank via the transfer port(s) (922, 924, 1022). The main chamber transport port (922, 924, 1022) may be a singular transport port that may extend for a majority of the length of the siphon wall 920 or may comprise multiple transfer ports such as 922 and 924 as shown in FIGS. 9 and 10. While FIGS. 9 and 10 illustrate two (2) transfer ports 922, 924, a greater or fewer number of transfer ports may be used. In some embodiments, a screen or mesh may cover the transfer ports (922, 924, 1022) in order to prevent solids of stray material from clogging the transfer port.

The cavity 1024 may provide a vertical fluid communication channel between the transfer port (922, 924, 1022) and a siphon outlet 934 formed at the bottom of the cavity 1024. The siphon outlet 934 may be vertically spaced away from the transfer port (922, 924, 1022). The siphon outlet 934 may be in fluid communication with the cavity 1024 and the transfer ports (922, 924, 1022). The dielectric fluid enters the second chamber 912 (also referred to as a reservoir chamber) via the outlet 934. The outlet 934 may have one or a plurality of outlet ports. For example, FIG. 11 illustrates two (2) outlets 934, but greater or fewer outlets may be used. The cavity 1024 may protect the dielectric cooling fluid from the atmosphere during fluid transfer because the atmosphere may act as an oxidant that may cause degradation of the dielectric cooling fluid. In an exemplary embodiment, the siphon wall 920 may be approximately 330 mm in height, and the back wall 932 may be 15.88 mm×2451.1 mm wide×273.05 mm.

As discussed above, a plurality of transfer ports—e.g., a first transfer port 922 and a second transfer port 924—may be formed within the siphon wall 920. The transfer ports 922, 924 may be formed on a surface of the siphon wall 920 that faces away from the back wall 932. The transfer ports 922, 924 may be more proximal to the top edge 921 than to the bottom edge 923. The transfer ports 922, 924 are located below a fluid surface 250 of the volume of dielectric cooling fluid that fills both the first chamber of the tank and the second chamber of the tank such that the transfer ports 922, 924 are between the floor 401 and the fluid surface 250 when the dielectric cooling fluid is moving through the siphon wall 920. This can be contrasted to a weir, in that the weir must be proximal to a fluid surface 250 so that the fluid may flow over the weir. Whereas with a siphon, the portion that transfer fluid is below a fluid level line such that the hydraulic pressure causes the fluid to move through the siphon. The fluid level line may be at various levels above the transfer ports 922, 924 of the siphon wall 920. The transfer ports 922, 924 may be spaced away from each other. The transfer ports 922, 924 may extend between the steps 929, 930 of the side edges 926, 928. In an exemplary embodiment, the transfer ports 922, 924 may each be 25.4 mm wide and 1219.2 mm long and may have a total of 768 holes (192×4) of 3.18 mm ID. The transfer ports 922, 924, in exemplary embodiments, may be 23.81 mm apart and 20.62 mm from the top edge 921 of the siphon wall 920.

In various embodiments, as shown in FIG. 9, the siphon wall 920 may divide the tank 400 to create a main chamber 910 and a buffer chamber (i.e., reservoir chamber) 912. The transfer ports 922, 924 face the main chamber 910 and the back wall 932 faces the buffer chamber 912. The main chamber 910 may have a greater volume than the reservoir chamber 912. In some embodiments, the main chamber 910 may be wider and deeper than the buffer chamber 912. The transfer ports 922, 924 are located such that a top line of the transfer ports 922, 924 is below the surface of the dielectric cooling fluid that fills the main chamber 910.

In various embodiments, as shown in FIGS. 9-12, the main chamber 910 may have installed therein computing device equipment and the buffer chamber 912 may act as a buffer fluid compartment after the dielectric cooling fluid has been warmed. As the dielectric cooling fluid flows through the ports in the distribution pipe 500, into the depressed alleys 404 and up through the pattern 702 of holes in the distribution plate 700—the dielectric cooling fluid flows up through the main chamber 910. The operation of the installed computing device equipment generates heat that eventually warms the dielectric cooling fluid. Thus, the exemplary following process (of the various embodiments) may be used to transport the warmed dielectric cooling fluid out of the system 900, into a cooling apparatus 218, and then re-introduce the cooled dielectric cooling fluid back into the system 900.

In instances in which the dielectric cooling fluid reaches a predetermined fluid level in the main chamber 910, the dielectric cooling fluid may move through the siphon wall 920 into the reservoir chamber 912. This may occur when the dielectric cooling fluid passes through the transfer ports 922, 924. Transfer ports may be included on the transfer ports 922, 924 to act as screens to filter and collect debris from the dielectric cooling fluid. Once the dielectric cooling fluid passes through the transfer ports 922, 924, the cooling fluid may enter the cavity 1024 of the back wall 932 (enters cavity 1024 via the ports 922, 924). Then, the cooling fluid may pass through the cavity 1024 into the buffer chamber 912. The enclosed cavity 1024 may prevent air bubbles from forming into the dielectric cooling fluid, as the dielectric cooling fluid enters the buffer chamber 912). The dielectric cooling fluid in the buffer chamber 912 may then pass through the tank outlet 914 (i.e., tank port) of the buffer chamber 912. The tank outlet 914 may transfer the dielectric cooling fluid into the heat exchanger 216, 280 (FIGS. 1A and 1B). The dielectric cooling fluid may then be put into a cooling apparatus 218 and then re-circulated into the system 900.

In an exemplary embodiment, the system 900 may have a total inlet mass flow rate of 3.95 kg/s per tank 400 at 40° C. inlet temperature. The inlet flow rate may be set at the above-mentioned value to ensure efficient heat dissipation in a 6 kW miner. However, in other embodiments, total mass flow rates may be greater or lesser. Computation fluid dynamics (CFD) results show that flow is well distributed with a mean of 0.165 kg/s and a standard deviation of 0.010 kg/s. The experimental dataset may have a mean of 0.161 kg/s and a standard deviation of 0.011 kg/s. Pressure at the outlets may range from 88 Pa to 116 Pa with a mean of 102 Pa and a standard deviation of 9 Pa. Minimum and maximum velocities at the outlet can be 0.41 m/s and 0.48 m/s, respectively, with a mean of 0.45 m/s and a standard deviation of 0.025 m/s. In this exemplary embodiment, 750 Pa may be acting on the tank outlet 914 of the buffer chamber 912 to stabilize the fluid level in the buffer chamber 912 and ensure that no air is sucked into the system 900. The tank 400 may be scalable to different form factors and input variables. A change in the number of computing device equipment (e.g., miners), power rating, distribution pipe clearance, and inlet flow rate would require the number and diameter of the holes on the distribution pipe 500 and the distribution plate 700 to be adjusted accordingly. The hole pattern on 702 the distribution plate 700 in the exemplary embodiment may be adjusted for specific types of miners. The hole pattern 702 can also be modified to suit a particular miner layout. The siphon wall 920 can also be modified according to the size of the tank 400 and therefore the miners served.

In an alternative embodiment, as shown in in FIGS. 12-14, the system 1000 may include a front wall 1002 and a rear wall 1004 as well as a first side wall 1006 and a second side wall 1008. A continuous ridge 1016 may be provided to support the siphon wall 1020 in some embodiments. A base attachment 1009 may be mounted on the side walls 1006, 1008 and the base attachment 1009 may abut the distribution plate 700. A siphon wall 1020 may be mounted into the base attachment 1009, and the siphon wall 1020 may be connected to the side walls 1006, 1008. The siphon wall 1020 may form a first chamber 1010 (sometimes referred to as a main chamber) and a second chamber 1012 (sometimes referred to as a buffer or reservoir chamber).

In an exemplary embodiment of the system 1000, as shown in FIG. 12-14, the transfer port 1022 may be located below the fluid surface 250 in the first chamber 1010. The tank outlet 1014 (i.e., tank port) in the second chamber 1012 may be located below the fluid level in the second chamber 1012.

Unlike the system 900 of FIG. 9, the system 1000 (FIGS. 12-14) may have one elongated transfer port 1022 on the siphon wall 1020. A pair of base fasteners 1018 may abut the base attachment 1009 and fasten the siphon wall 1020 to the distribution plate 700. A plurality of wall fasteners 1019 may be mounted to the rear wall 1004 and extend to and fasten to a back side of the siphon wall 1020. In an exemplary embodiment, there are four wall fasteners 1019 that are spaced away from each other and are connected to a side of siphon wall 1020 that faces away from the transfer port 1022, and the wall fasteners 1019 may be mounted just above the cavity 1024. The tank outlet 1014 may have a bolt-like cap on the end (FIG. 12) or a mesh-like screen outlet 1015 (FIG. 13).

Referring to all drawings and according to various embodiments of the present disclosure, an exemplary embodiment of the system 300, 600, 800 for providing uniform fluid distribution of dielectric cooling fluid to a plurality of computing devices in an immersion cooling system may include a tank 400 defining an open interior volume, a distribution pipe 500 positioned on the floor 401 and running across the length of the tank 400. A distribution plate 700 may be positioned over the distribution pipe 500, and at least one computing device 230, 310 mounted on the distribution plate 700. The dielectric cooling fluid may enter the open interior volume of the tank 400 through the plurality of ports in the distribution pipe 500. In the dielectric cooling fluid may flow through multiple repeated sets of the pattern of holes 702 in the distribution plate 700 to contact the at least one computing device 230, 310. Heat dissipates from the at least one computing device 230, 310 into the dielectric cooling fluid.

In one embodiment, a floor 401 of the tank 400 may include a plurality of alternating elevated platforms and alleys 402, 404. The distribution pipe 500 may include a plurality of ports that each align with one of the alleys 404. The distribution plate 700 may have a pattern of holes 702 in multiple repeated sets. Each of the at least one computing device 230, 310 may be aligned with one set of the pattern of holes 702.

In one embodiment, the distribution pipe 500 may be connected on one end to an inlet of the tank 400 and is capped on an opposite end.

Exemplary embodiments may further include a rack configured to house twenty-four computing devices 230 in the at least one tank 400. The plurality of ports may include thirteen equally spaced ports along each of two opposite sides (404) of the distribution pipe 500. The pattern of holes in the multiple repeated sets 702 may be twenty holes repeated twenty-four times over the distribution plate 700.

In one embodiment, each of the plurality of ports in the distribution pipe 500 may have an internal diameter of 10 mm, and each hole in the pattern of holes 702 in the distribution plate 700 may have an internal diameter of 5 mm.

In one embodiment, the distribution plate 804 may be positioned such that there is a 6.5 mm clearance gap between the top of the distribution pipe 802 and the bottom of the distribution plate 804.

In one embodiment, dielectric cooling fluid may be oil. In one embodiment, the system 300, 600, 800 may further include an oil-to-water heat exchanger 216, 280.

In one embodiment, at least one computing device 230 may include twenty-four servers housed in each of at least one rack within the tank 400.

In one embodiment, at least one computing device 230 may include twenty-four servers housed in each of at least one rack within the tank 400.

In one embodiment, the floor 401 of the tank 400 may include twelve elevated platforms 402 and thirteen alleys 404.

According to an aspect of the present disclosure, the system 900 may include uniform fluid distribution of dielectric cooling fluid to a plurality of computing devices 230 in an immersion cooling system include a tank 400 defining an open interior volume; a distribution pipe 500 positioned on a floor and the distribution pipe 500 has a plurality of ports; a distribution plate 700 positioned over the distribution pipe 500, wherein the distribution plate 700 has a pattern of holes 702; a siphon wall 920 mounted within the tank 400 and extends from the floor, the siphon wall 920 is configured to divide the open interior volume to define a first chamber 910 and a second chamber 912, and wherein the distribution plate 700 and the distribution pipe 500 are located in the first chamber 910; a tank outlet 914, 1014 is located on the tank 400 along the second chamber 912; and a rack configured to house at least one computing device 230 over the distribution plate 700, wherein the primary circuit dielectric cooling fluid enters the first chamber 910 of the tank 400 through the plurality of ports in the distribution pipe 500, wherein the primary circuit dielectric cooling fluid flows through the pattern of holes 702 in the distribution plate 700 to contact the at least one computing device 230, and wherein heat dissipates from the at least one computing device 230 into the dielectric cooling fluid, and the dielectric cooling fluid is configured to flow through a transfer port 922, 924 into the second chamber 912, wherein the transfer port 922, 924 is located below the dielectric cooling fluid level line, and the dielectric cooling fluid exits the tank 400 via the tank outlet 914, 1014.

In one embodiment, the tank may have a pair of side walls 906, 908, 1006, 1008 and an attachment structure 909, 1009 mounted on the floor 401, and siphon wall 920, 1020 may be mounted to the floor 401 via the attachment structure 909, 1009 and the siphon wall 920, 1020 may abut the pair of side walls 906, 908, 1006, 1008.

In one embodiment, the siphon wall 920 may have a first edge 921 and a second edge 923 that are spaced away from each other, the second edge 923 may be proximal to the floor 401, a plurality of transfer ports 922, 924 may be proximal to the first edge 921 and located below the fluid surface 250 such that the plurality of transfer ports 922, 924 are located between the floor 401 and the fluid surface 250, and the plurality of transfer ports 922, 924 may be spaced away from each other.

In one embodiment, the siphon wall 1020 may have an elongated transport port 1022 that is located below the fluid surface 250 such that the elongated transfer port 1022 is located between the floor 401 and the fluid surface 250, the tank has a length, and the elongated transfer port may extend the length of the tank.

In one embodiment, the siphon wall 920, 1020 may have a back wall 932 that forms a cavity 1024, the cavity 1024 providing a vertical fluid communication channel between the transfer port 922, 924, 1022 and a siphon outlet 934, wherein the primary circuit dielectric cooling fluid flows from the first chamber 910 to the second chamber 912 by flowing through the transfer port 922, 924, 1022 through the cavity 1024 and out of the siphon outlet 934.

In one embodiment, the siphon wall 1020 may be directly fastened to the distribution plate 700.

As explained above and shown in FIGS. 9-14, an exemplary embodiment of the method for providing uniform fluid distribution of cooling fluid to a plurality of computing devices in an immersion cooling system may include distributing primary circuit dielectric cooling fluid into a first chamber 910, 1010 of a tank 400 through a first set of a plurality of holes in a distribution pipe 500 and a second set of a plurality of holes 702 in a distribution plate 700, the first set and second set of the plurality of holes may be aligned, flowing the primary circuit dielectric cooling fluid onto at least one computing device 230, and the at least one computing device 230 may be mounted on the distribution plate 700. In some aspects, dividing the tank into the first chamber 910, 1010 and a second chamber 912, 1012 with a siphon wall 920, 1020, the siphon wall 920, 1020 has at least a transfer port, passing the primary circuit dielectric cooling fluid from the first chamber 910, 1010 to the second chamber 912, 1012 through the transfer port 922, 924, 1022 of the siphon wall 920, 1020, and sending the primary circuit dielectric cooling fluid out of the tank 400 via a tank outlet 914, 1014 located in the second chamber 912, 1012.

The foregoing descriptions of systems, devices, and methods are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. An immersion cooling system configured to cool a plurality of computing devices using a primary circuit dielectric cooling fluid, the system comprising:
   a tank defining an open interior volume;
   a distribution pipe positioned on a floor and the distribution pipe has a plurality of ports;
   a distribution plate positioned over the distribution pipe, wherein the distribution plate has a pattern of holes;
   a siphon wall mounted within the tank and extends from the floor, the siphon wall is configured to divide the open interior volume to define a first chamber and a second chamber, and wherein the distribution plate and the distribution pipe are located in the first chamber;
   a tank outlet is located on the tank along the second chamber; and
   a rack configured to house at least one of the plurality of computing devices over the distribution plate,
      wherein the primary circuit dielectric cooling fluid enters the first chamber of the tank through the plurality of ports in the distribution pipe,
      wherein the primary circuit dielectric cooling fluid flows through the pattern of holes in the distribution plate to contact the at least one computing device, and
      wherein heat dissipates from the at least one computing device into the dielectric cooling fluid, and the dielectric cooling fluid is configured to flow through a transfer port into the second chamber, wherein the transfer port is located below the dielectric cooling fluid surface, and the dielectric cooling fluid exits the tank via the tank outlet.

2. The immersion cooling system of claim 1, wherein the tank has a pair of side walls and an attachment structure mounted on the floor, and siphon wall is mounted to the floor via the attachment structure and the siphon wall abuts the pair of side walls.

3. The immersion cooling system of claim 1, wherein
   the siphon wall has a first edge and a second edge that are spaced away from each other, and the second edge is proximal to the floor,
   wherein the transfer port comprises a plurality of transfer ports proximal to the first edge and each located below the dielectric cooling fluid surface such that the plurality of transfer ports are located between the floor and the dielectric cooling fluid surface, and
   the plurality of transfer ports are spaced away from each other.

4. The immersion cooling system of claim 1, wherein
   the transfer port is an elongated transfer port that is located below the dielectric cooling fluid surface such that the elongated transfer port is located between the floor and the dielectric cooling fluid surface, and
   the tank has a length and the elongated transfer port extends the length of the tank.

5. The immersion cooling system of claim 1, wherein the siphon wall further comprises
   a back wall that forms a cavity, the cavity providing a vertical fluid communication channel between the transfer port and a siphon outlet
   wherein the primary circuit dielectric cooling fluid flows from the first chamber to the second chamber by flowing through the transfer port through the cavity and out of the siphon outlet.

6. The immersion cooling system of claim 1, wherein the siphon wall is directly fastened to the distribution plate.

7. A method for an immersion cooling system to distribute a primary circuit dielectric cooling fluid to a plurality of computing devices, the method comprising:
   distributing the primary circuit dielectric cooling fluid into a first chamber of a tank through a first set of a plurality of holes in a distribution pipe and a second set of a plurality of holes in a distribution plate, wherein the first set and second set of the plurality of holes are aligned;
   flowing the primary circuit dielectric cooling fluid onto at least one computing device, wherein the at least one computing device is mounted on the distribution plate;
   dividing the tank into the first chamber and a second chamber with a siphon wall, and wherein the siphon wall has at least a transfer port;
   passing the primary circuit dielectric cooling fluid from the first chamber through the siphon wall into the second chamber, wherein the dielectric cooling fluid flows through a transfer port located in the siphon wall below a dielectric cooling fluid surface; and
   sending the primary circuit dielectric cooling fluid out of the tank via an outlet located in the second chamber.

8. The immersion cooling system of claim 1, wherein the tank has a one end with an inlet and an opposite end, the distribution pipe is connected on the one end to the inlet of the tank and is capped on the opposite end.

9. The immersion cooling system of claim 1, further comprising:
   a rack configured to house twenty-four computing devices in the at least one tank, wherein:
      the plurality of ports comprises thirteen equally spaced ports along each of two opposite sides of the distribution pipe; and the pattern of holes in the multiple repeated sets comprises twenty holes repeated twenty-four times over the distribution plate.

10. The immersion cooling system of claim 1, wherein:
each of the plurality of ports in the distribution pipe has an internal diameter of 10 mm; and
each hole in the pattern of holes in the distribution plate has an internal diameter of 5 mm.

11. The immersion cooling system of claim 1, wherein the distribution plate is positioned such that there is a 6.5 mm clearance gap between the top of the distribution pipe and the bottom of the distribution plate.

12. The immersion cooling system of claim 1, wherein the primary circuit dielectric cooling fluid comprises oil.

13. The immersion cooling system of claim 12, further comprising:
an oil-to-water heat exchanger.

14. The immersion cooling system of claim 1, wherein the at least one computing device comprises twenty-four servers housed in each of at least one rack within the tank.

15. The immersion cooling system of claim 1, wherein the floor of the tank comprises twelve elevated platforms and thirteen alleys.

16. The immersion cooling system of claim 1, further comprising a screen disposed over the transfer port, wherein the screen is configured to prevent stray material from clogging the transfer port.

17. The immersion cooling system of claim 16, wherein the screen is disposed proximate to the first chamber.

* * * * *